US008242683B2

(12) United States Patent
Abe et al.

(10) Patent No.: US 8,242,683 B2
(45) Date of Patent: Aug. 14, 2012

(54) ELECTRONIC DISPLAY INCLUDING A LIGHT-EMITTING ELEMENT AND A COLOR FILTER SANDWICHED BETWEEN TWO POLARIZERS

(75) Inventors: Hiroko Abe, Tokyo (JP); Mitsuaki Osame, Kanagawa (JP); Aya Anzai, Kanagawa (JP); Yu Yamazaki, Kanagawa (JP); Yoshifumi Tanada, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 301 days.

(21) Appl. No.: 12/346,181

(22) Filed: Dec. 30, 2008

(65) Prior Publication Data
US 2009/0179549 A1 Jul. 16, 2009

Related U.S. Application Data

(62) Division of application No. 10/816,185, filed on Apr. 2, 2004, now abandoned.

(30) Foreign Application Priority Data

Apr. 7, 2003 (JP) ................................. 2003-103114

(51) Int. Cl.
H01J 1/62 (2006.01)
H01J 63/04 (2006.01)
(52) U.S. Cl. ...................................... 313/501
(58) Field of Classification Search .......... 313/498–512; 257/88
See application file for complete search history.

(56) References Cited

U.S. PATENT DOCUMENTS

| 4,769,242 | A | 9/1988 | Shibanai |
| 4,769,292 | A | 9/1988 | Tang |
| 5,283,132 | A | 2/1994 | Ogura |
| 5,396,406 | A | 3/1995 | Ketchpel |
| 5,856,819 | A | 1/1999 | Vossler |
| 6,011,580 | A | 1/2000 | Hattori |
| 6,097,147 | A | 8/2000 | Baldo |
| 6,291,255 | B1 | 9/2001 | Huang |

(Continued)

FOREIGN PATENT DOCUMENTS

CA 2 406 411 A1 10/2001
(Continued)

OTHER PUBLICATIONS

Exhibition of Active Matrix Type Organic EL Display at "13th Flat Panel Display Manufacturing Technology Expo & Conference" by ELDis Group (in Japanese with full translation); Jul. 2, 2003.

(Continued)

Primary Examiner — Toan Ton
Assistant Examiner — Zachary Snyder
(74) Attorney, Agent, or Firm — Fish & Richardson P.C.

(57) ABSTRACT

It is an object of the invention to achieve weight saving and downsizing of an electronic apparatus, in particular a portable electronic apparatus while enlarging a display screen thereof. The invention provides an electronic apparatus using a light emitting device which includes a light emitting element, a color filter provided on either side of an anode or a cathode of the light emitting element, and two polarizers sandwiching the light emitting element and the color filter, in which the anode and the cathode transmit light, deflection angles of the two polarizers are different from each other, and light obtained from the light emitting element is white.

20 Claims, 15 Drawing Sheets

U.S. PATENT DOCUMENTS

| | | |
|---|---|---|
| 6,356,029 B1 | 3/2002 | Hunter |
| 6,380,687 B1 | 4/2002 | Yamazaki |
| 6,445,005 B1 | 9/2002 | Yamazaki |
| 6,552,496 B2 | 4/2003 | Yamazaki |
| 6,583,770 B1 | 6/2003 | Antila |
| 6,621,508 B1 | 9/2003 | Shiraishi |
| 6,656,608 B1 | 12/2003 | Kita |
| 6,657,260 B2 | 12/2003 | Yamazaki |
| 6,661,029 B1* | 12/2003 | Duggal ............................ 257/89 |
| 6,689,492 B1 | 2/2004 | Yamazaki |
| 6,730,966 B2 | 5/2004 | Koyama |
| 6,747,609 B2 | 6/2004 | Antila et al. |
| 6,762,436 B1 | 7/2004 | Huang |
| 6,774,573 B2 | 8/2004 | Yamazaki |
| 6,774,877 B2 | 8/2004 | Nishitoba |
| 6,778,229 B2 | 8/2004 | Inoue |
| 6,784,457 B2 | 8/2004 | Yamazaki |
| 6,801,185 B2 | 10/2004 | Salley |
| 6,830,828 B2 | 12/2004 | Thompson |
| 6,863,997 B2 | 3/2005 | Thompson et al. |
| 6,869,695 B2 | 3/2005 | Thompson et al. |
| 6,872,472 B2 | 3/2005 | Liao |
| 6,887,592 B2 | 5/2005 | Hieda |
| 6,893,743 B2 | 5/2005 | Sato |
| 6,894,312 B2 | 5/2005 | Yamazaki |
| 6,911,271 B1 | 6/2005 | Lamansky |
| 6,911,772 B2* | 6/2005 | Cok ............................ 313/501 |
| 6,939,624 B2 | 9/2005 | Lamansky et al. |
| 6,942,931 B2 | 9/2005 | Lee et al. |
| 6,951,694 B2 | 10/2005 | Thompson et al. |
| 6,970,144 B1 | 11/2005 | Swift |
| 6,982,462 B2 | 1/2006 | Koyama |
| 6,995,816 B2 | 2/2006 | Mi |
| 6,998,772 B2 | 2/2006 | Terumoto |
| 7,019,714 B2 | 3/2006 | Uchida et al. |
| 7,034,451 B2 | 4/2006 | Senbonmatsu |
| 7,060,370 B2 | 6/2006 | Kinoshita |
| 7,060,371 B2 | 6/2006 | Akiyama |
| 7,064,740 B2 | 6/2006 | Daly |
| 7,139,053 B2 | 11/2006 | Yuuki |
| 7,148,502 B2 | 12/2006 | Yamazaki et al. |
| 7,161,185 B2 | 1/2007 | Yamazaki et al. |
| 7,211,823 B2 | 5/2007 | Tung |
| 7,218,365 B2 | 5/2007 | Chang |
| 7,256,422 B2 | 8/2007 | Yamazaki |
| 7,327,335 B2 | 2/2008 | Yamazaki et al. |
| 7,381,479 B2 | 6/2008 | Lamansky et al. |
| 7,525,119 B2 | 4/2009 | Koyama |
| 7,548,027 B2 | 6/2009 | Yamazaki |
| 2001/0048405 A1 | 12/2001 | Salley |
| 2002/0025419 A1 | 2/2002 | Lee et al. |
| 2002/0027416 A1 | 3/2002 | Kim |
| 2002/0093284 A1 | 7/2002 | Adachi |
| 2002/0113546 A1 | 8/2002 | Seo et al. |
| 2002/0140343 A1 | 10/2002 | Hirabayashi |
| 2003/0017361 A1 | 1/2003 | Thompson |
| 2003/0035755 A1* | 2/2003 | Chen et al. ....................... 422/52 |
| 2003/0054199 A1 | 3/2003 | Oh |
| 2003/0057419 A1 | 3/2003 | Murakami |
| 2003/0063456 A1 | 4/2003 | Katahira |
| 2003/0103022 A1 | 6/2003 | Noguchi |
| 2003/0129452 A1 | 7/2003 | Tsuji |
| 2003/0175553 A1* | 9/2003 | Thompson et al. ........... 428/690 |
| 2003/0210360 A1 | 11/2003 | Yoshida |
| 2004/0113162 A1* | 6/2004 | Mai ................. 257/88 |
| 2004/0144974 A1 | 7/2004 | Lee |
| 2004/0151829 A1 | 8/2004 | Boroson |
| 2004/0169461 A1 | 9/2004 | Moriyama |
| 2004/0169624 A1 | 9/2004 | Yamazaki et al. |
| 2004/0183082 A1 | 9/2004 | Yamazaki |
| 2004/0195965 A1* | 10/2004 | Yamazaki et al. ............ 313/506 |
| 2004/0201341 A1 | 10/2004 | Miyachi |
| 2004/0202893 A1 | 10/2004 | Abe |
| 2004/0226200 A1 | 11/2004 | Salley |
| 2004/0262576 A1 | 12/2004 | Thompson |
| 2004/0263066 A1 | 12/2004 | Abe |
| 2005/0012686 A1 | 1/2005 | Osame |
| 2005/0024339 A1 | 2/2005 | Yamazaki |
| 2005/0077817 A1 | 4/2005 | Yamazaki |
| 2005/0100660 A1 | 5/2005 | Ito |
| 2005/0123791 A1 | 6/2005 | Deaton |
| 2005/0162092 A1 | 7/2005 | Yamazaki |
| 2005/0202278 A1 | 9/2005 | Mishima |
| 2005/0253789 A1 | 11/2005 | Ikeda |
| 2006/0024526 A1 | 2/2006 | Thompson et al. |
| 2009/0218573 A1 | 9/2009 | Koyama |

FOREIGN PATENT DOCUMENTS

| | | |
|---|---|---|
| EP | 0 881 617 A1 | 12/1998 |
| EP | 1 065 723 A2 | 1/2001 |
| EP | 1 107 220 A2 | 6/2001 |
| EP | 1 227 390 A2 | 7/2002 |
| JP | 07-244267 | 9/1995 |
| JP | 09-127885 | 5/1997 |
| JP | 09-204155 | 8/1997 |
| JP | 10-255976 | 9/1998 |
| JP | 10255976 A | 9/1998 |
| JP | 2001-086205 | 3/2001 |
| JP | 2001-181617 | 7/2001 |
| JP | 2001-285445 | 10/2001 |
| JP | 2001-332392 | 11/2001 |
| JP | 2001-343908 | 12/2001 |
| JP | 2001-356714 | 12/2001 |
| JP | 2002-149112 A | 5/2002 |
| JP | 2002-156920 | 5/2002 |
| JP | 2002-189230 | 7/2002 |
| JP | 2002189230 A | 7/2002 |
| JP | 2002-304136 A | 10/2002 |
| JP | 2002-334787 | 11/2002 |
| JP | 2002-334789 | 11/2002 |
| JP | 2003-012777 | 1/2003 |
| JP | 2003-029240 A | 1/2003 |
| JP | 2003-036974 A | 2/2003 |
| JP | 2003-058069 | 2/2003 |
| JP | 3408154 | 5/2003 |
| JP | 2003-531405 A | 10/2003 |
| JP | 2004-095340 A | 3/2004 |
| TW | 515109 B | 12/2002 |
| WO | 01/80204 A2 | 10/2001 |
| WO | WO-02/15645 | 2/2002 |
| WO | WO-03/059015 | 7/2003 |

OTHER PUBLICATIONS

Documents distributed in the "13th Flat Panel Display Manufacturing Technology Expo & Conference" by ELDis Group (5 pages), Jul. 2, 2003.

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

K.H. Lee et al., "QCIF Full Color Transparent AMOLED Display," SID 2003 International Symposium Digest of Technical Papers, vol. XXXIV, Book 1, May 20, 2003, pp. 104-107.

Baldo, M et al., "*Highly Efficient Phosphorescent Emission From Organic Electroluminescent Devices*," Nature, Sep. 10, 1998, vol. 395, pp. 151-154.

Tang, C et al., "*Organic Electroluminescent Diodes*," Applied Physics Letters, Sep. 21, 1987, vol. 51, No. 12, pp. 913-915.

Kido, J et al., "*Multilayer White Light-Emitting Organic Electroluminescent Device*," Science, Mar. 3, 1995, vol. 267, pp. 1332-1334.

Andrade, B et al., "*White Light Emission Using Triplet Excimers In Electrophosphorescent Organic Light-Emitting Devices*," Advanced Materials, Aug. 5, 2002, vol. 14, No. 15, pp. 1032-1036.

Lai, S et al., "*Probing D8-D8 Interactions In Luminescent Mono- And Binuclear Cyclometalated Platinum(II) Complexes of 6-Phenyl-2,2'-Bipyridines*" Inorganic Chemistry, 1999, vol. 38, No. 18, pp. 4046-4055.

Lai, S et al., "*Spectroscopic Properties of Luminescent Platinum(Ii) Complexes Containing 4,4',4"-Tri-Tert-Butyl-2,2':6',2"-Terpyridine(Tbu3tpy).Crystal Structures of [PT(TBU3TPY)CL]CLO4AND [PT(TBU3TPY) {CH2C(O)ME}CLO4]*," Inorganic Chemistry, 1999, vol. 38, No. 19, pp. 4262-4267.

Kvam, P et al., "Spectroscopic and Electrochemical Properties of Some Mixed-Ligand Cyclometalated Platinum(II) Complexes Derived From 2-Phenylpyridine," ACTA Chemica Scandinavica, 1995, vol. 49, pp. 335-343.

Junji Kido et al., "Bright White-Light-Emitting Organic El Device," The 46th Japan Society of Applied Physics and Related Societies, Mar. 28, 1999, vol. 28A-ZD-25, No. 3, p. 1281, with full English translation.

Documents distributed in the "13th Flat Panel Display Manufacturing Technology Expo & Conference" by ELDis Group (5 pages).

Lai, S et al., "Spectroscopic Properties Of Luminescent Platinum(Ii) Complexes Containing 4,4';4"-Tri-Teri-Butyl-2,2':6',2"-Terpyridine(Tbu3tpy).Crystal Structures of [PT(TBU3TPY)CL] CLO4AND [PT(IBU3TPY) {CH2C(O)ME} CLO4]," Inorganic Chemistry, 1999, vol. 38, No. 19, pp. 4262-4267.

Office Action, Taiwanese Application No. 93108910, dated Dec. 28, 2010, 17 pages with English translation.

Office Action, Korean Application No. 2004-0023514, dated Sep. 30, 2010, 9 pages with English translation.

* cited by examiner

ELECTRONIC DISPLAY INCLUDING A LIGHT-EMITTING ELEMENT AND A COLOR FILTER SANDWICHED BETWEEN TWO POLARIZERS

CROSS-REFERENCE TO RELATED APPLICATIONS

This application is a divisional of U.S. application Ser. No. 10/816,185, filed Apr. 2, 2004, now pending, which claims the benefit of a foreign priority application filed in Japan as Serial No. 2003-103114 on Apr. 7, 2003, both of which are incorporated by reference.

TECHNICAL FIELD

The present invention relates to an electronic apparatus using a light emitting device, and more particularly to a portable electronic apparatus.

BACKGROUND ART

Portable electronic apparatuses typified by a portable phone, an electronic databook, and the like have been required to be equipped with various functions such as transmission/reception of e-mail, voice recognition, image pickup with a small-size camera as well as a display device for displaying images, while there have been strong demand of users for downsizing and weight saving. Therefore, it is required that the larger number of ICs having a larger circuit scale and higher memory capacity is formed in a limited volume of the portable electronic apparatus. In order to achieve higher performance of the portable electronic apparatus while securing enough space for mounting ICs and also achieve the downsizing and weight saving thereof, an essential key is to fabricate a flat panel to be mounted as thin and light as possible.

For example, in the case of a liquid crystal display device which is used for a portable electronic apparatus with relative frequency, a light source, an optical waveguide, and the like are required when it is of a light transmissive type, which prevents the thinner shape and the weight saving. Meanwhile, in the case of a reflective type which utilizes the outside light, an image cannot be recognized easily in a dark place, which makes it difficult to take advantage of a portable electronic apparatus in its usability in any place. In recent years, a light emitting device using light emitting elements as display elements has been researched and developed to be mounted on a portable electronic apparatus. Since a light emitting element emits light by itself, a clear image can be displayed in a dark place without a need of a light source, unlike the case of using a liquid crystal display device. Accordingly, there is no need of using a backlight component such as a light source and an optical waveguide, which enables the thinner shape and the weight saving of the display device.

DISCLOSURE OF INVENTION

Problems to be Solved by the Invention

By using a light emitting device, higher performance, downsizing, and weight saving of a portable electronic apparatus can be achieved, while there remains a problem concerning how a display screen can be enlarged. One of the reasons is that a larger volume of information is required to be displayed in accordance with the higher performance of a portable electronic apparatus. Besides, there is another reason that the demand for a portable electronic apparatus with enlarging a display screen for senior citizens is increasing with the increase of the population of senior citizens.

In view of the foregoing problems, it is an object of the invention to achieve weight saving and downsizing of an electronic apparatus, in particular a portable electronic apparatus while enlarging a display screen thereof.

Means for Solving the Problems

In order to solve the above problems, the invention takes the following measures. A structure of a light emitting device in which light from light emitting elements can be emitted to both screen sides is employed, whereby an area capable of displaying images is increased twice as large by using both the front and back screen sides. In the case of displaying different images on each screen, video signals corresponding to two screens are alternately inputted. By using the light emitting device capable of performing display on both screen sides in this manner, downsizing and weight saving of the light emitting device can be achieved while enlarging an area capable of displaying images.

It should be noted that the light emitting device includes a light emitting panel in a state of being sealed with light emitting elements and a module in a state where an IC or the like including a controller is mounted on the panel.

A full color image is displayed on at least one screen of the light emitting device. Specifically, a full color image can be obtained by using a light emitting element for white emission in each pixel, and passing light that is emitted from the light emitting element through a color filter. A full color image by the use of a color filter is the existing technology which has been established in a liquid crystal display, and it has the advantage of being applied to a light emitting device easily. Further, it has another advantage that a fine selective coating of an electroluminescent material with a shadow mask is not required as compared to a method of performing a full color display by using light emitting elements each corresponding to three primary colors, thus luminance variations in accordance with the passage of time is uniform among all the colors. There is no concern that purity of red color is decreased due to a low color conversion efficiency, or that a pixel emits light due to the outside light such as sunlight because of the color conversion material itself being a fluorescent body, which may lower contrast, as in the case of a CCM method in which blue light is converted into green or red light by using a color conversion material formed of a fluorescent material.

In addition, in the case of using a light emitting element for white emission, it is possible that a full color image is displayed on one screen side while a monochrome image is displayed on the other screen side by providing a color filter on one screen side. In this case, the number of pixels for the monochrome display can be increased three times as large as those of other methods for full color displays. It should be noted that since light transmissivity of a color filter differs between each color, luminance of a light emitting element which is obtained through the color filter may vary in each color correspondingly. In this case, when a voltage applied to a light emitting element is changed in each color in order to correct colors, a light emitting element which is applied with the highest voltage decays most quickly, while a light emitting element which is applied with the lowest voltage decays slowly, which tends to the luminance variations in accordance with the passage of light emission time. According to the invention, an image is displayed by using a light emitting element which is applied with the lowest voltage in the case of displaying a monochrome image on the opposite side to a side provided with a color filter. According to the above structure, variations in degradation of light emitting elements due to a difference in the applied voltage can be suppressed.

A TFT using polysilicon has a problem in that its characteristics easily vary due to a defect in a crystal grain boundary. When a threshold voltage of a TFT varies, luminance of a light emitting element of which flowing current is controlled by the TFT also varies. Further, there is another problem that luminance of a light emitting element decays with the degradation of an electroluminescent material. When the electroluminescent material degrades, luminance decays even when a current supplied to the light emitting element is constant. The degree of degradation depends on a light emission period and the amount of flowing current. Therefore, when a gray level differs among pixels depending on a displayed image, degradation of a light emitting element in each pixel also differs, leading to variations in luminance.

Luminance decay with the degradation of an electroluminescent layer can be suppressed to a certain level by operating a transistor for controlling a current value which is supplied to a light emitting element in a saturation region. Since a drain current in a saturation region largely influences a flowing current relatively to a slight change in the gate-source voltage Vgs, it is required that the gate-source voltage Vgs does not change during a period in which the light emitting element emits light. Therefore, it is required that capacity of a capacitor provided between the gate and the source of the transistor is increased, and the off-current of a transistor for controlling an input of a video signal to a pixel is suppressed low. Further, there is another problem that the Vgs of the transistor for controlling a current value which is supplied to the light emitting element changes with the switching of other transistors, and a potential change in a signal line and a scan line, and the like. This derives from a parasitic capacitance of the gate of the transistor.

According to the invention, the following pixel configuration can be adopted for a light emitting device besides the above measure.

First, In addition to a transistor for supplying a current to a light emitting element (driving transistor), a transistor (current controlling transistor) which functions as a switching element is connected to a driving transistor in series. The gate potential of the driving transistor is fixed, whereby the driving transistor operates in a saturation region, through which a current can flow constantly. The current controlling transistor operates in a linear region, whereby a video signal is inputted to the gate of the current controlling transistor.

The current controlling transistor operates in a linear region, therefore, its source-drain voltage (drain voltage) Vds is quite small relatively to a voltage Vel which is applied to the light emitting element, and thus a slight change in the gate-source voltage (gate voltage) Vgs does not influence the current supplied to the light emitting element. The driving transistor operates in a saturation region, therefore, its drain current does not change by the drain voltage Vds, but is determined only by the Vgs. That is, the current controlling transistor only selects whether or not to supply a current to the light emitting element, and a current value supplied to the light emitting element is determined by the driving transistor which operates in a saturation region. Accordingly, a current supplied to the light emitting element is not influenced even without increasing capacity of a capacitor which is provided between the gate and the source of the current controlling transistor or suppressing the off-current of a transistor for controlling an input of a video signal to a pixel. In addition, the current supplied to the light emitting element is not influenced by a parasitic capacitance of the gate of the current controlling transistor. Therefore, cause of variations is decreased and image quality can thus be enhanced to a great extent. By operating the driving transistor in a saturation region, a value of the drain current is kept relatively constant even when the Vds is decreased in stead of the Vel increasing due to the degradation of the light emitting element. Accordingly, a luminance decay can be suppressed even when the light emitting element degrades. Further, since it is not necessary to optimize the process in order to suppress off-current of the transistor for controlling an input of a video signal to a pixel, the manufacturing process of a transistor can be simplified, leading to the cost reduction and improvement in yield.

L of the driving transistor may be longer than W thereof, and L of the current controlling transistor may be equal to or shorter than W thereof. The ratio of L to W of the driving transistor is desirably 5 or more. According to the above structure, luminance variations of light emitting elements among pixels due to the characteristic variations of driving transistors can be suppressed.

A transistor used in the light emitting device of the invention may be a transistor formed by using single crystalline silicon, a transistor formed by using an SOI, or a thin film transistor formed by using polycrystalline silicon or amorphous silicon. Alternatively, a transistor using an organic semiconductor or a transistor using carbon nanotube may be used. In addition, a transistor provided in a pixel of the light emitting device of the invention may have a single-gate structure, a double-gate structure, or a multi-gate structure having more gate electrodes.

Effect of the Invention

By using the light emitting device of the invention which is capable of performing display on both screen sides, downsizing and weight saving of the light emitting device can be achieved while enlarging an area capable of displaying an image. A full color display through the use of a color filter is the existing technology which has been established in a liquid crystal display, and it has the advantage of being applied to a light emitting device easily. Further, it has another advantage that a fine selective coating of an electroluminescent material with a shadow mask is not required as compared to a method of performing a full color display by using light emitting elements corresponding to three primary colors, thus luminance variations with the passage of time is uniform among all the colors. There is no concern as in the case of a CCM method in which blue light is converted into green or red light by using a color conversion material formed of a fluorescent material, that purity of red color is decreased due to a low color conversion efficiency, or a pixel emits light due to the outside light such as sunlight because of the color conversion material itself being a fluorescent body, which may otherwise lower contrast.

BRIEF DESCRIPTION OF THE DRAWINGS

FIGS. 9A to 9C are diagrams each showing a switching of a scan direction.

BEST MODE FOR CARRYING OUT THE INVENTION

Embodiment modes of the invention are described below with reference to the accompanying drawings. It is to be understood that the invention can be carried out in various different modes, and therefore various changes and modifications are apparent to those skilled in the art unless departing from the point or the scope of the invention. Therefore, the invention is not to be understood to be limited to the description of the present embodiment modes.

Embodiment Mode 1

Figure 1A:
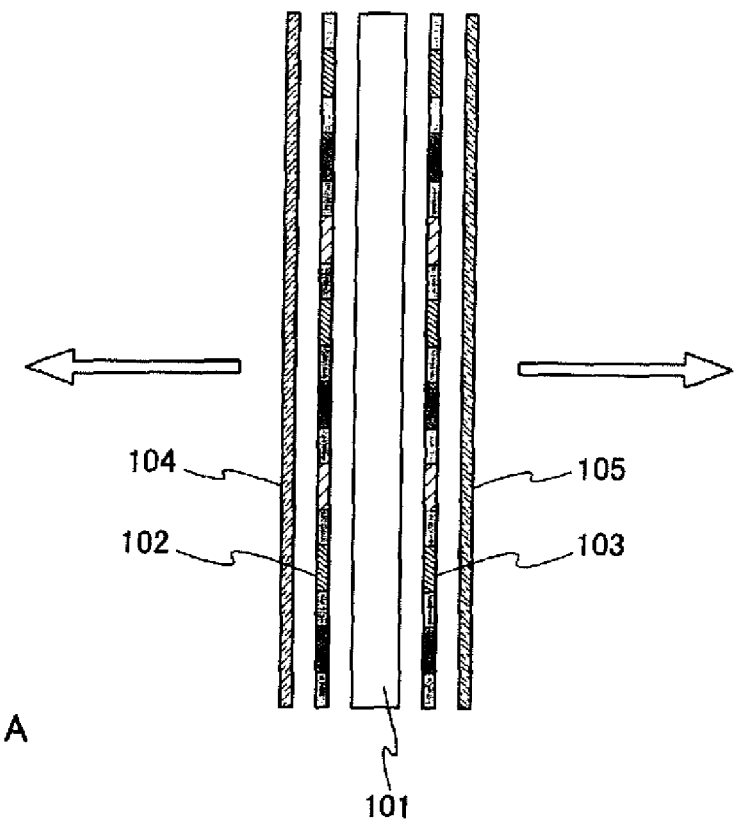
FIGS. 1A and 1B are diagrams each showing a cross sectional structure of a light emitting device.

A specific structure of the invention is described with reference to FIG. 1. FIG. 1A shows one mode of a cross sectional structure of the light emitting device of the invention. The light emitting device of the invention shown in FIG. 1A includes a light emitting panel 101 in which a light emitting element is disposed in each pixel, two color filters 102 and 103 sandwiching the light emitting panel 101, and two polarizers 104 and 105 sandwiching the light emitting panel 101 and the color filters 102 and 103.

The light emitting panel 101 has a structure in which light from the light emitting element is emitted to the both sides as shown by hollow arrows. Specifically, each light emitting element employs an electrode having a light transmitting characteristic (light transmissivity) as an anode and a cathode. The light emitting element is characterized by emitting white light. Among the light emitted from both sides of the light emitting panel 101, light having a wavelength within a certain range passes through the color filters 102 and 103, and light having a certain deflection component passes through the polarizers 104 and 105.

Figure 2A:
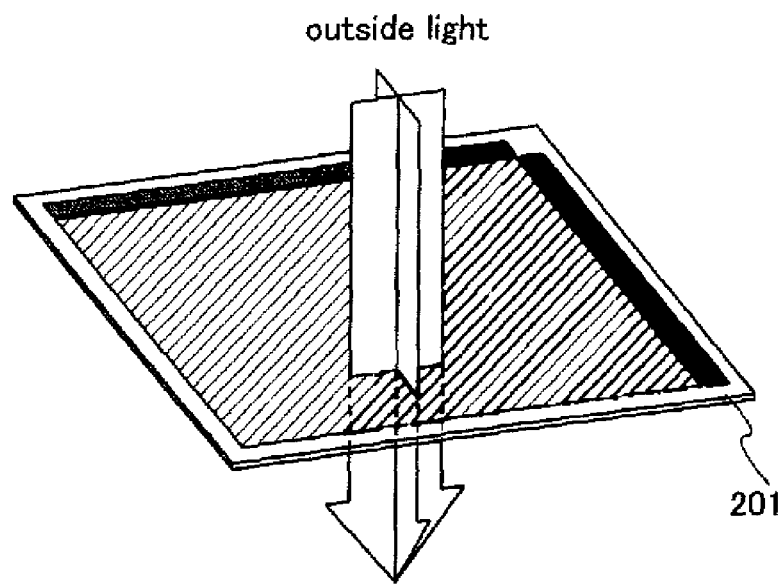
FIGS. 2A and 2B are views each showing a structure of a light emitting device using a polarizer.
Figure 2B:
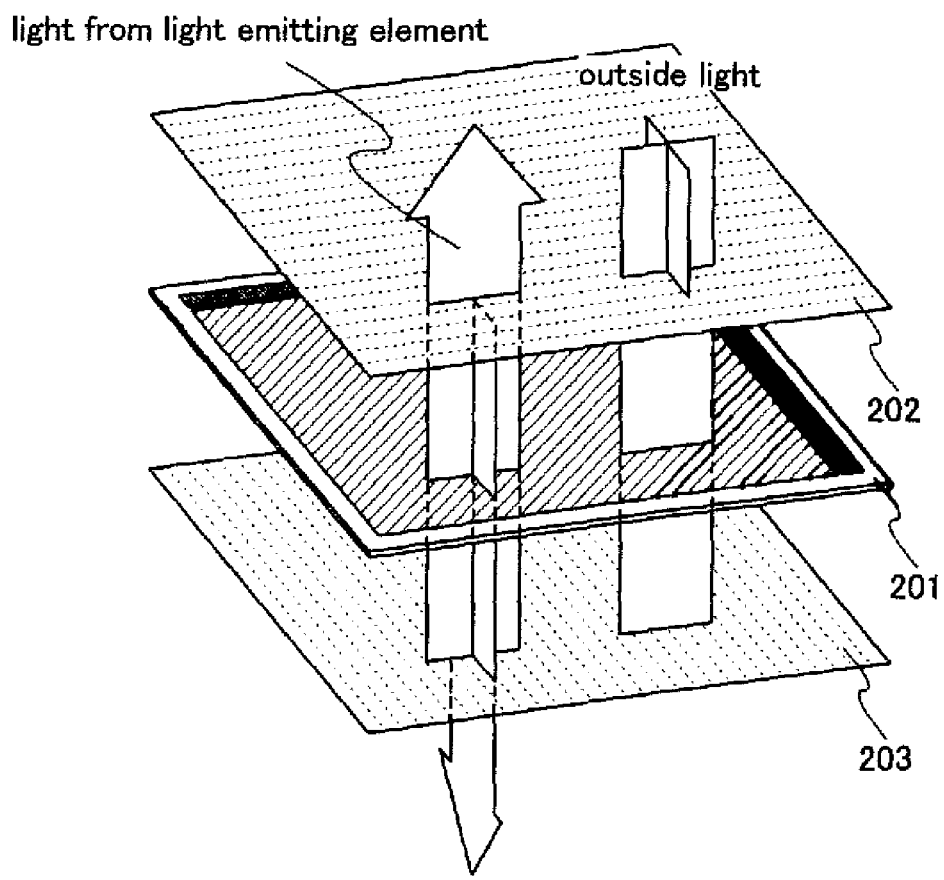

The polarizers 104 and 105 are disposed so that their deflection angles for transmission are different from each other, and preferably to be different by 90° in order to prevent the light emitting panel 201 from transmitting the outside light. FIG. 2A shows a direction of the outside light which passes through a light emitting panel 201 in the case of providing no polarizer FIG. 2B shows a direction of the light emitted from the light emitting panel 201 in the case of sandwiching the light emitting panel 201 by two polarizers 202 and 203 each having a different deflection angle.

In the case of providing no polarizer as shown in FIG. 2A, each of an anode and a cathode of a light emitting element provided in the light emitting panel 201 transmits light. Therefore, the light emitting panel 201 transmits outside light, and thus a far side of the light emitting panel 201 can be seen through by human eyes. On the other hand, in the case of providing polarizers 202 and 203 as shown in FIG. 2B, only one of the two polarizers 202 and 203 transmits outside light. Therefore, it is prevented that a far side of the light emitting panel 201 is seen through, and a contrast of an image can thus be enhanced. However, since specific deflection component of the light emitted from the light emitting panel 201 passes through each of the polarizers 202 and 203, light can be obtained from both sides.

Figure 1B:
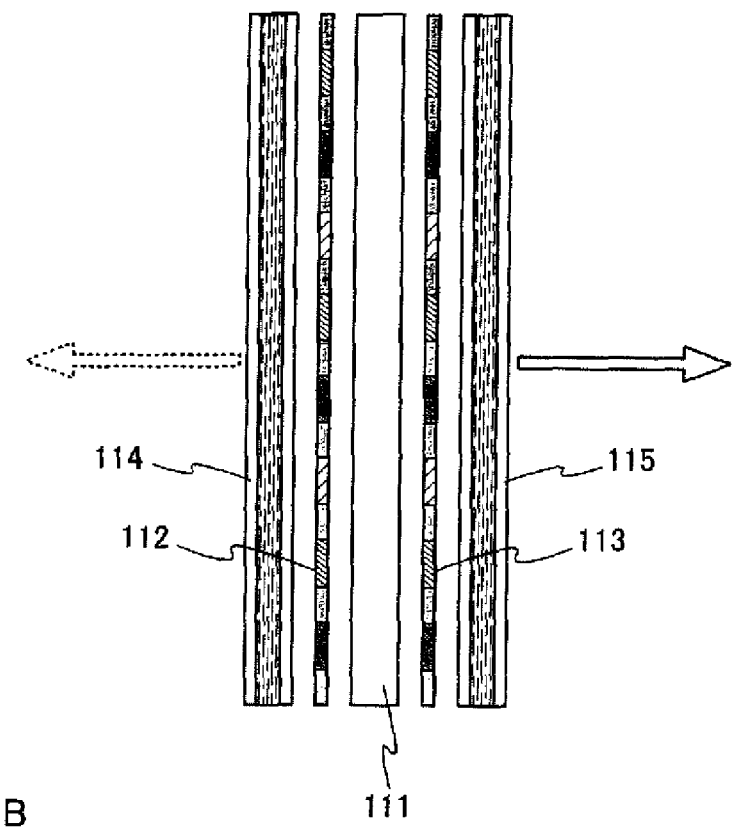

FIG. 1B shows another mode of a cross sectional structure of the light emitting element of the invention, which is different from FIG. 1A. The light emitting device of the invention shown in FIG. 1B includes a light emitting panel 111 in which a light emitting element is disposed in each pixel, two color filters 112 and 113 sandwiching the light emitting panel 111, and two liquid crystal panels 114 and 115 sandwiching the light emitting panel 111 and the color filters 112 and 113.

As in FIG. 1A, the light emitting panel 111 has a structure in which light from the light emitting element is emitted to both sides. Specifically, each light emitting element employs an electrode having a light transmitting characteristic as each of an anode and a cathode. The light emitting element is characterized by emitting white light. Among the light emitted from the both sides of the light emitting panel 111, light having a wavelength within a certain range passes through the color filters 112, and 113, and the light passes through only one of the liquid crystal panels 114 and 115.

Each of the liquid crystal panels 114 and 115 includes a pixel electrode, a counter electrode, and liquid crystal sandwiched between the pixel electrode and the counter electrode. Further, a polarizer and the like are provided. Light transmittancy of each of the liquid crystal panels 114 and 115 is controlled by a voltage applied between the pixel electrode and the counter electrode. The two liquid crystal panels 114 and 115 are controlled to be driven in such a manner that only one of them transmits light whereas the other does not transmit light. According to the above structure, it can be prevented that the light emitting panel 111 transmits outside light.

It should be noted in FIG. 1A and FIG. 1B that a color filter is separately provided from each of the light emitting panels 101 and 111, however, a film which functions as a color filter may be provided inside the light emitting panel.

Figure 3A:
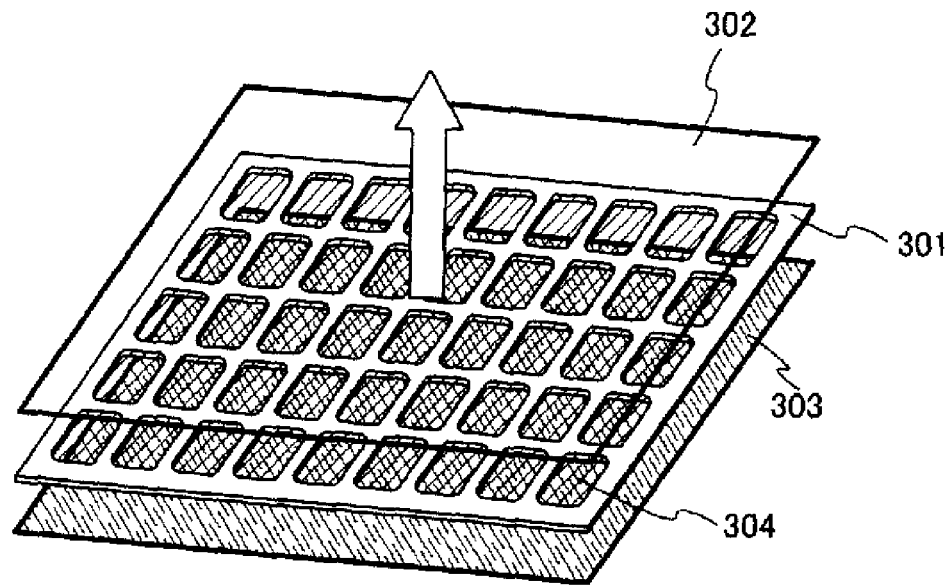
FIGS. 3A and 3B are views each showing a structure of a light emitting device using a liquid crystal panel.
Figure 3B:
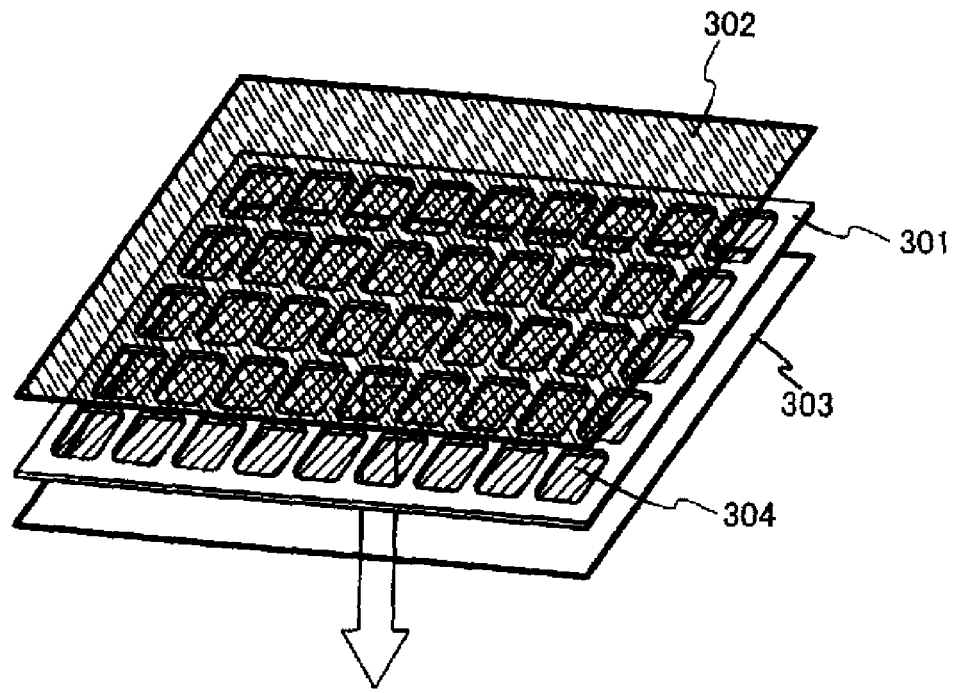

FIG. 3A shows a view of a light emitting device including a light emitting panel 301 which is sandwiched between two liquid crystal panels 302 and 303, in which light passes through the liquid crystal panel 302. FIG. 3B shows a view of a light emitting device including the light emitting panel 301 sandwiched by the two liquid crystal panels 302 and 303, in which light passes through the liquid crystal panel 303.

As shown in FIG. 3A and FIG. 3B, the liquid crystal panels 302 and 303 are driven in such a manner that one of them blocks light while the other transmits light. Accordingly, light emitted from a light emitting element 304 of the light emitting panel 301 passes only one side as shown by a hollow arrow. According to the above structure, it can be prevented that a far side of the light emitting panel 301 is seen through by human eyes due to the outside light passing therethrough, which can enhance a contrast. Switching of video signals can be performed in synchronization with the switching of the light transmittancy of the liquid crystal panels 302 and 303. Specifically, a video signal having image data for the side transmitting light is inputted to the light emitting panel 301 regardless of which liquid crystal panel transmits light. According to the above structure, different images can be displayed on both sides of the light emitting panel 301 in parallel.

It should be noted that a color filter is provided on both sides of the light emitting panel in each of FIG. 1A and FIG. 1B, however, it may be provided on only one side. In that case, a monochrome image is displayed on the side of the light emitting panel having no color filter. In the case of a full color display, neutral colors are expressed by three pixels corresponding to three primary colors of red(R), green(G) and blue(B), while in the case of a monochrome display, an image is displayed basically by using one pixel since an achromatic color is required. However, the achromatic color can not be expressed by one pixel when using the method of performing a full color with light emitting elements corresponding to three primary colors or using a CCM method. Thus, according to these two methods, an image is displayed by using three pixels as one unit on the side for performing a monochrome display as well as the side for performing a full color display. Meanwhile, the invention employs a light emitting element for white emission, therefore, a monochrome display can be performed with one pixel without providing a color filter on one screen side.

It should be noted that according to this embodiment mode, the light emitting panel may be either of an active matrix type or of a passive matrix type.

As described in this embodiment mode, since the light emitting device of the invention can display images on both sides of the light emitting panel, downsizing and weight saving of the light emitting device can be achieved while enlarging an area capable of displaying images. The structure of the invention is effective in particular for portable electronic apparatuses, which place major emphasis on the downsizing and weight saving.

Embodiment Mode 2

Figure 4A:
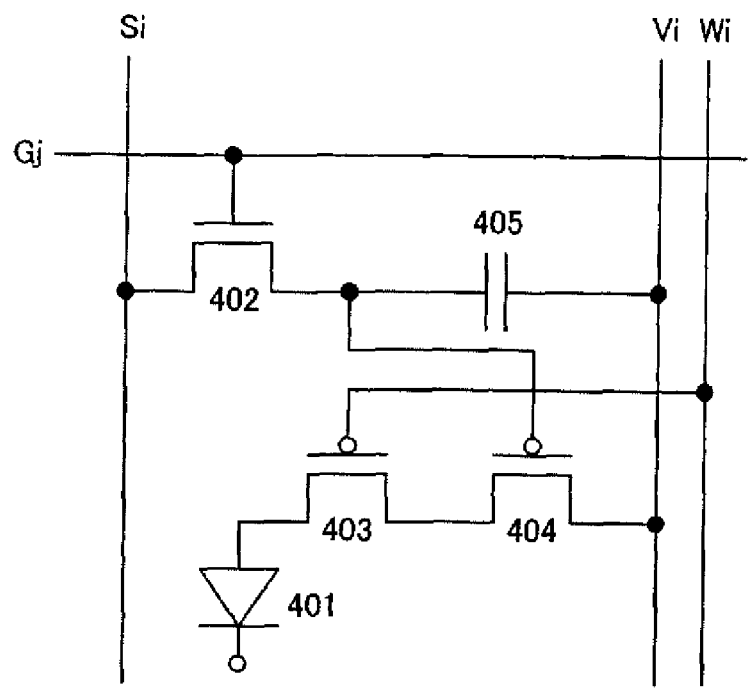
FIGS. 4A and 4B are circuit diagrams each showing a pixel of a light emitting device.

FIG. 4A shows one mode of a pixel of the light emitting device of the invention. The pixel shown in FIG. 4A includes a light emitting element 401, a transistor (switching transistor) 402 used as a switching element for controlling an input of a video signal to the pixel, a driving transistor 403 for controlling a current value supplied to the light emitting element 401, and a current controlling transistor 404 for selecting whether or not to supply a current to the light emitting element 401. Further, a capacitor 405 for storing a potential of a video signal may be provided in the pixel as in this embodiment mode.

The driving transistor 403 and the current controlling transistor 404 have the same polarity. In FIG. 4A, both of them are of a P-type, however, they may be of an N-type. According to the invention, the driving transistor 403 operates in a saturation region while the current controlling transistor 404 operates in a linear region. A channel length L of the driving transistor 403 may be longer than a channel width W thereof. L of the current controlling transistor 404 may be equal to or shorter than W thereof. The ratio of L to W of the driving transistor 403 is desirably five or more. The driving transistor 403 may be either an enhancement mode transistor or a depletion mode transistor.

The gate of the switching transistor 402 is connected to a scan line Gj (j=1 to y). One of the source and the drain of the switching transistor 402 is connected to a signal line Si (i=1 to x) and the other is connected to the gate of the current controlling transistor 404. The gate of the driving transistor 403 is connected to a second power supply line Wi (i=1 to x). The driving transistor 403 and the current controlling transistor 404 are connected to a first power supply line Vi (i=1 to x) and the light emitting element 401 so that a current supplied from the first power supply line Vi (i=1 to x) is supplied to the light emitting element 401 as a drain current of each of the driving transistor 403 and the current controlling transistor 404. In this embodiment mode, the source of the current controlling transistor 404 is connected to the first power supply line Vi (i=1 to x) while the drain of the driving transistor 403 is connected to a pixel electrode of the light emitting element 401.

It should be noted that the source of the driving transistor 403 may be connected to the first power supply line Vi (i=1 to x) while the drain of the current controlling transistor 404 may be connected to the pixel electrode of the light emitting element 401. The driving transistor 403 is a depletion mode transistor.

The light emitting element 401 includes an anode, a cathode, and an electroluminescent layer sandwiched between the anode and the cathode. As shown in FIG. 4A, in the case where the anode is connected to the driving transistor 403, the anode is the pixel electrode while the cathode is a counter electrode. The counter electrode of the light emitting element 401 and the first power supply line Vi (i=1 to x) have a potential difference so that a forward bias current is supplied to the light emitting element 401.

One of the two electrodes of the capacitor 405 is connected to the first power supply line Vi (i=1 to x) and the other is connected to the gate of the current controlling transistor 404. The capacitor 405 is provided so as to store the potential difference between the electrodes of the capacitor 405 when the switching transistor 402 is not selected (OFF state). It should be noted that FIG. 4A shows a configuration having the capacitor 405, however, the invention is not limited to this and the capacitor 405 may not be provided.

In FIG. 4A, the driving transistor 403 and the current controlling transistor 404 are P-channel transistors, and the drain of the driving transistor 403 is connected to the anode of the light emitting element 401. On the other hand, when the driving transistor 403 and the current controlling transistor 404 are N-channel transistors, the source of the driving transistor 403 is connected to the cathode of the light emitting element 401. In this case, the cathode of the light emitting element 401 is the pixel electrode while the anode thereof is the counter electrode.

Next, a driving method of the pixel shown in FIG. 4A is described. The operation of the pixel shown in FIG. 4A can be divided into a writing period and a holding period. First, in the writing period, when the scan line Gj (j=1 to y) is selected, the switching transistor 402 whose gate is connected to the scan line Gj (j=1 to y) is turned ON. Then, a video signal inputted to signal lines Si to Sx is inputted to the gate of the current controlling transistor 404 through the switching transistor 402. It should be noted that the driving transistor 403 is constantly ON since its gate is connected to the second power supply line Wi (i=1 to x).

When the current controlling transistor 404 is turned ON by a video signal, a current is supplied to the light emitting element 401 through the first power supply line Vi (i=1 to x). The current controlling transistor 404 at this time operates in a linear region, therefore, a current supplied to the light emitting element 401 is determined by the V-I characteristics of the driving transistor 403 which operates in a saturation region and the light emitting element 401. The light emitting element 401 emits light at a luminance corresponding to the supplied current. When the current controlling transistor 404 is turned OFF by a video signal, no current is supplied to the light emitting element 401, thus the light emitting element 401 does not emit light.

In the holding period, the switching transistor 402 is turned OFF by controlling a potential of the scan line Gj (j=1 to y), and a potential of the video signal which is written in the writing period is held. When a video signal which turns ON the current controlling transistor 404 is inputted in the writing period, a current supply to the light emitting element 401 is kept on as the potential of the video signal is held in the capacitor 405. On the other hand, when a video signal which turns OFF the current controlling transistor 404 is inputted in the writing period, the potential of the video signal is held in the capacitor 405, therefore, no current is supplied to the light emitting element 401.

The current controlling transistor 404 operates in a linear region, therefore, its source-drain voltage (drain voltage) Vds is quite small relatively to the voltage Vel which is applied to the light emitting element, and thus a slight change in the gate-source voltage (gate voltage) Vgs does not influence the current supplied to the light emitting element 401. The driving transistor 403 operates in a saturation region, therefore, its drain current does not change by the drain voltage Vds, but is determined only by the Vgs. That is, the current controlling transistor 404 only selects whether or not to supply a current to the light emitting element 401, and a current value supplied to the light emitting element 401 is determined by the driving transistor 403 which operates in a saturation region. Accordingly, change in the current supplied to the light emitting element 401 can be suppressed even without increasing the capacity of a capacitor 405 which is provided between the gate and the source of the current controlling transistor 404 or suppressing the off-current of the switching transistor 402. By operating the driving transistor 403 in a saturation region, a value of the drain current is kept relatively constant even when the Vds is decreased instead of the Vel increasing due to the degradation of the light emitting element 401. Accordingly, luminance decay can be suppressed even when the light emitting element 401 degrades.

L of the driving transistor may be longer than W thereof, and L of the Current controlling transistor may be equal to or shorter than W thereof. The ratio of L to W of the driving transistor is desirably five or more. According to the above structure, luminance variations of light emitting elements among pixels due to characteristic variations of driving transistors can be suppressed.

It should be noted that the gate potential of the driving transistor 403 may be changed between each of R, G and B in order to keep a white balance. When the gate potential of the driving transistor 403 may be equal among all the pixels, it is possible that the second power supply line is formed in parallel with the scan line, and the second power supply line is used in common for pixels as well as the scan line.

Embodiment Mode 3

In this embodiment mode, one mode of a pixel of the light emitting device of the invention is described, which is different from that in FIG. 4A.

Figure 4B:
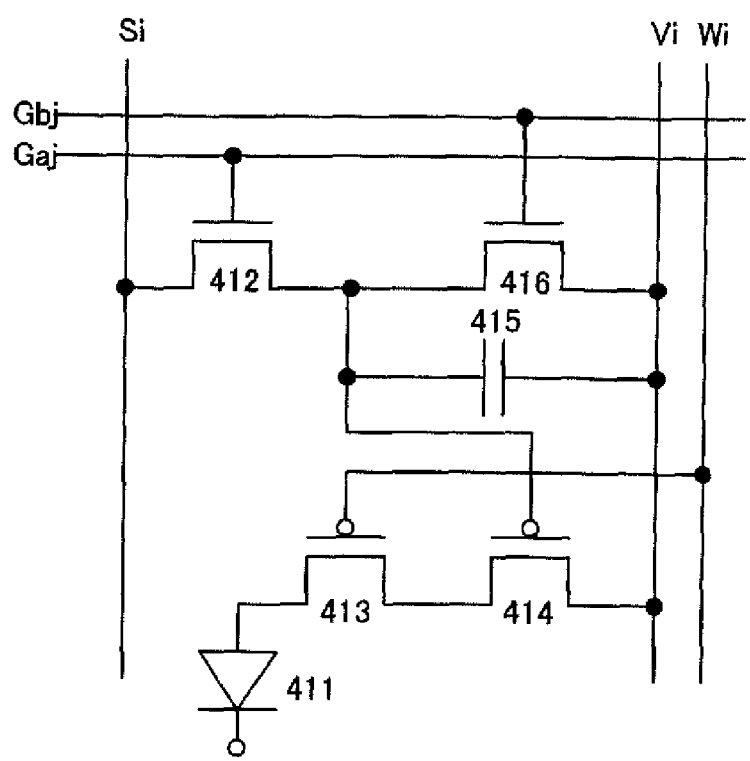

The pixel shown in FIG. 4B includes a light emitting element 411, a switching transistor 412, a driving transistor 413, a current controlling transistor 414, and a transistor (erasing transistor) 416 for erasing a potential of a written video signal. Further, a capacitor 415 may be provided in the pixel in addition to the above elements. The driving transistor 413 and the current controlling transistor 414 have the same polarity. According to the invention, the driving transistor 413 operates in a saturation region while the current controlling transistor 414 operates in a linear region. L of the driving transistor 413 may be longer than W thereof. L of the current controlling transistor 414 may be equal to or shorter than W thereof. The ratio of L to W of the driving transistor 413 is desirably five or more.

The driving transistor 413 may be either an enhancement mode transistor or a depletion mode transistor.

The gate of the switching transistor 412 is connected to a first scan line Gaj (j=1 to y). One of the source and the drain of the switching transistor 412 is connected to the signal line Si (i=1 to x) and the other is connected to the gate of the current controlling transistor 414. The gate of the erasing transistor 416 is connected to a second scan line Gbj (j=1 to y), and one of the source and the drain thereof is connected to the first power supply line Vi (i=1 to x) while the other is connected to the gate of the current controlling transistor 414. The gate of the driving transistor 413 is connected to the second power supply line Wi (i=1 to x). The driving transistor 413 and the current controlling transistor 414 are connected to the first power supply line Vi (i=1 to x) and the light emitting element 411 so that a current supplied from the first power supply line Vi (i=1 to x) is supplied to the light emitting element 411 as a drain current of each of the driving transistor 413 and the current controlling transistor 414. In this embodiment mode, the source of the current controlling transistor 414 is connected to the first power supply line Vi (i=1 to x) while the drain of the driving transistor 413 is connected to a pixel electrode of the light emitting element 411. It is also possible that the source of the driving transistor 413 is connected to the first power supply line Vi (i=1 to x) while the drain of the current controlling transistor 414 is connected to the pixel electrode of the light emitting element 411.

The light emitting element 411 includes an anode, a cathode, and an electroluminescent layer sandwiched between the anode and the cathode. As shown in FIG. 4B, in the case where the anode is connected to the driving transistor 413, the anode is the pixel electrode while the cathode is a counter electrode. The counter electrode of the light emitting element 411 and the first power supply line Vi (i=1 to x) have a potential difference so that a forward bias current is supplied to the light emitting element 411.

One of the two electrodes of the capacitor 415 is connected to the first power supply line Vi (i=1 to x) and the other is connected to the gate of the current controlling transistor 414.

In FIG. 4B, the driving transistor 413 and the current controlling transistor 414 are P-channel transistors, and the drain of the driving transistor 413 is connected to the anode of the light emitting element 411. On the other hand, when the driving transistor 413 and the current controlling transistor 414 are N-channel transistors, the source of the driving transistor 413 is connected to the cathode of the light emitting element 411. In this case, the cathode of the light emitting element 411 is the pixel electrode while the anode thereof is the counter electrode.

The operation of the pixel shown in FIG. 4B can be divided into a writing period, a holding period, and an erasing period. The operations of the switching transistor 412, the driving transistor 413, and the current controlling transistor 414 in the writing period and the holding period are the same as in FIG. 4A.

In the erasing period, a second scan line Gbj (j=1 to y) is selected and the erasing transistor 416 is turned ON. Then, the potential of the first power supply lines V1 to Vx is supplied to the gate of the current controlling transistor 414 through the erasing transistor 416. Thus, the current controlling transistor 414 is turned OFF, which can forcibly turn the light emitting element 411 into a state in which no current is supplied.

Embodiment 1

In this embodiment, one configuration example of a light emitting element used in the light emitting device of the invention is described.

Figure 5A:
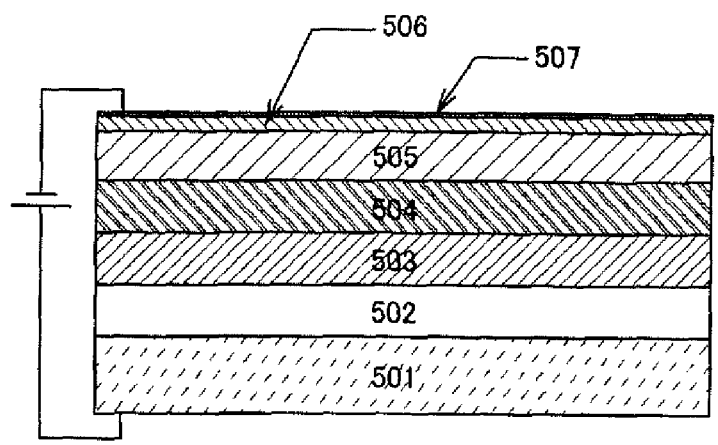
FIGS. 5A to 5C are diagrams each showing a cross sectional structure of a light emitting element.

FIG. 5A shows a schematic diagram of a cross sectional structure of a light emitting element in the light emitting device of the invention. As a structure of the element, a hole injection layer 502 including copper phthalocyanine (CuPc), a first light emitting layer 503 including 4,4'-bis[N-(1-naphthyl)-N-phenyl-amino]-biphenyl (abbreviated to á-NPD), a second light emitting layer 504 including 4,4'-N,N'-dicarbazolyl-biphenyl (abbreviated to CBP) as a guest material and Pt(ppy)acac as a host material, an electron transporting layer 505 including BCP, an electron injection layer 506 including CaF2, and a cathode 507 including Al are laminated in this order on an anode 501 formed of an ITO as a transparent conductive film. Pt(ppy)acac can be expressed by the following Formula 1. [Formula I]

[Formula 1]

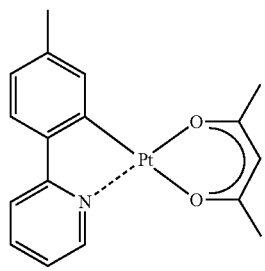

(1)

According to the invention, dual emission can be realized by forming the cathode 507 thin enough to transmit light, specifically, to be about 20 nm thick.

In the second light emitting layer 504 of the light emitting element shown in FIG. 5A, Pt(ppy)acac as a host material is dispersed with CBP with a concentration of 10 wt % or more as a guest material, which is a phosphorescent material, thereby exhibiting both phosphorescence from the phosphorescent material and emission from the phosphorescent material in the excimer state. Specifically, the phosphorescent material exhibits emission having two or more peaks in the region from 500 nm to 700 nm, and it is desirable that one of the two or more peaks corresponds to the excimer emission. The first light emitting layer 503 exhibits blue emission of which highest peak in the emission spectrum is located in the region from 400 nm to 500 nm. When the blue emission is mixed with the emission from the second light emitting layer, white emission having the color purity quite close to 0 can be obtained. In addition, since only one kind of dopant is used, stable white emission can be supplied with the unchanged form of the emission spectrum even in the case where a current density is changed or in the case of performing a sequential drive. It should noted that the first light emitting layer may have a structure in which a host material is dispersed with a guest material which exhibits blue emission of which highest peak in the emission spectrum is located in the region from 400 nm to 500 nm.

Figure 5B:
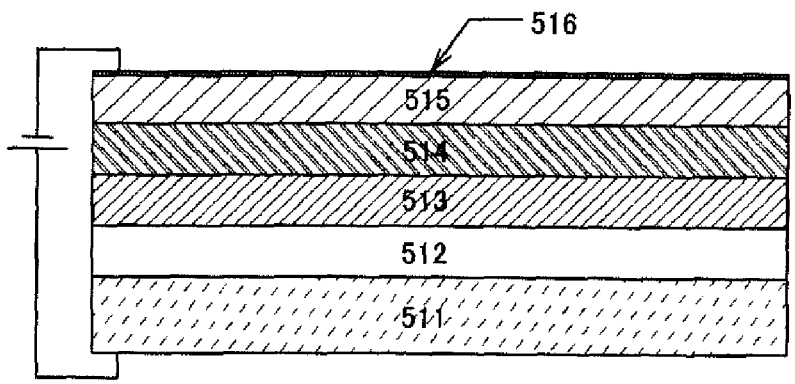

FIG. 5B shows a schematic diagram of a cross sectional structure of a light emitting element in the light emitting device of the invention, which is different from FIG. 5A. As a structure of the element, a hole injection layer 512 including polythiophene, a hole transporting layer 513 including N,N'-bis(3-methylphenyl)-N,N'-diphenyl-1,1'-biphenyl-4,4'-diamine (abbreviated to TPD), a first light emitting layer 514 including rubrene as a guest material and TPD as a host material, a second light emitting layer 515 including coumarin 6 as a guest material and Alq$_3$ as a host material, and a cathode 516 including Al are laminated in this order on an anode 511 formed of an ITO as a transparent conductive film.

In FIG. 5B also, dual emission of white light can be realized by forming the cathode 516 to be thin enough to transmit light, specifically, to be about 20 nm thick.

Figure 5C:
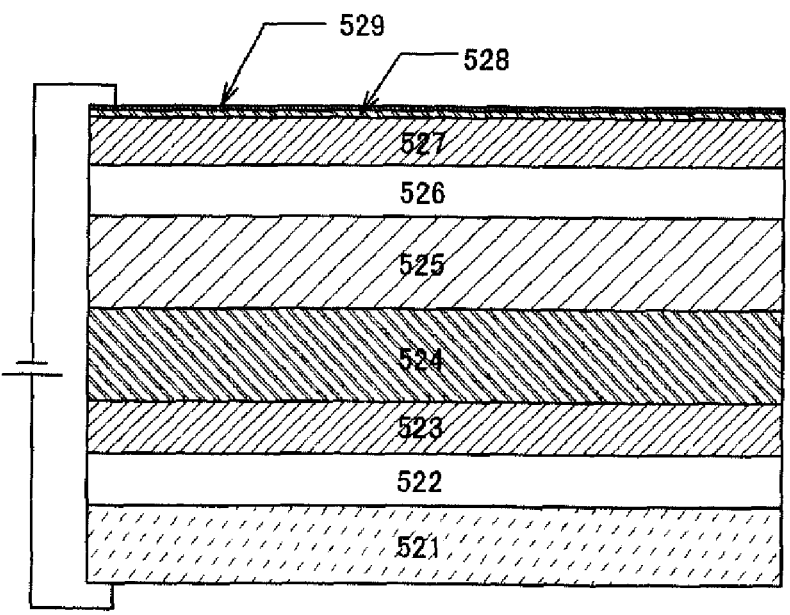

FIG. 5C shows a pattern diagram of a cross sectional structure of a light emitting element in the light emitting device of the invention, which is different from FIG. 5A. As a structure of the element, a hole injection layer 522 including HIM34, a hole transporting layer 523 including tetraaryl benzidine derivative, a first light emitting layer 524 including naphthacene derivative as a guest material and tetraaryl benzidine derivative and phenyl anthracene derivative as host materials, a second light emitting layer 525 including styryl amine derivative as a guest material and tetraaryl benzidine derivative and phenyl anthracene derivative as host materials, an electron transporting layer 526 including phenyl anthracene derivative, an electron injection layer 527 including Alq$_3$, a first cathode 528 including CsI, and a second cathode 529 including MgAg are laminated in this order on an anode 521 formed of an ITO as a transparent conductive film.

In FIG. 5C also, dual emission of white light can be realized by forming the first cathode 528 and the second cathode 529 to have a total thickness that is thin enough to transmit light, specifically, to be about 20 nm thick.

The laminated structure of the light emitting element in this embodiment mode is not limited to the ones shown in FIGS. 5A to 5C. It should be noted that as a method for obtaining light from the cathode side, there is a method of using ITO which is doped with Li to have lower work function as well as the method of obtaining a thin film. A light emitting element used in the invention is required to have at least a structure in which light is emitted to both sides of the anode and the cathode.

Embodiment 2

In this Embodiment, an embodiment of a pixel of the light emitting device of the invention which is described in Embodiment Mode 1 is described.

Figure 6A:
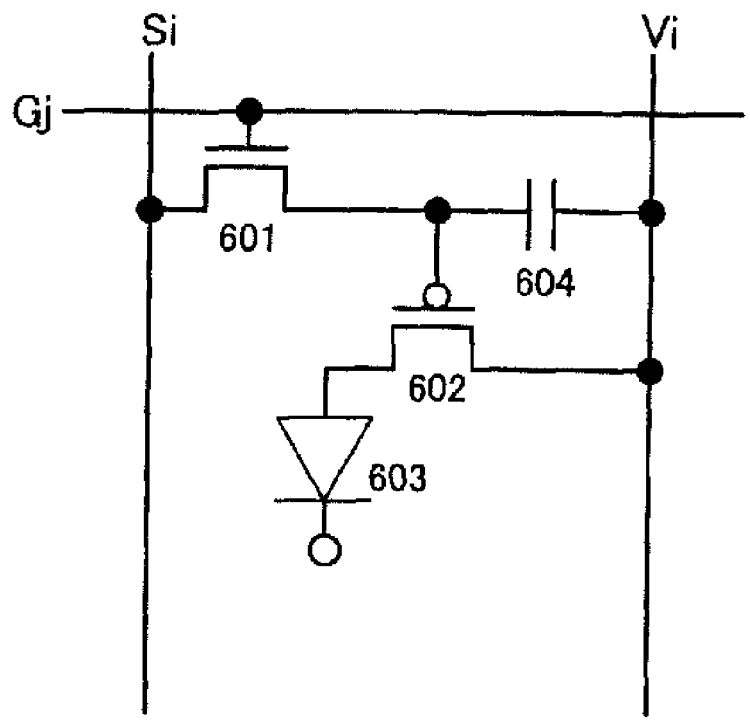
FIGS. 6A and 6B are circuit diagrams each showing a pixel of a light emitting device.

FIG. 6A shows a circuit diagram of a pixel of this embodiment. In FIG. 6A, reference numeral 601 denotes a switching transistor. The gate of the switching transistor 601 is connected to the scan line Gj (j=1 to y). One of the source and the drain of the switching transistor 601 is connected to the signal line Si (i=1 to x) and the other is connected to the gate of a driving transistor 602. One of the source and the drain of the driving transistor 602 is connected to the power supply line Vi (i=1 to x) and the other is connected to a pixel electrode of a light emitting element 603.

The light emitting element 603 includes an anode, a cathode, and an electroluminescent layer sandwiched between the anode and the cathode. In the case where the anode is connected to the source or the drain of the driving transistor 602, the anode is the pixel electrode while the cathode is a counter electrode. On the other hand, in the case where the cathode is connected to the source or the drain of the driving transistor 602, the cathode is the pixel electrode while the anode is the counter electrode. It should be noted that the driving transistor 602 is desirably a P-channel transistor when the source or the drain of the driving transistor 602 is connected to the anode of the light emitting element 603. Meanwhile, the driving transistor 602 is desirably an N-channel transistor when the source or the drain of the driving transistor 602 is connected to the cathode of the light emitting element 603.

Each of the counter electrode of the light emitting element 603 and the power supply line Vi is supplied with a voltage from a power supply. A voltage difference between the counter electrode and the power supply line is kept at a level which enables a forward bias voltage to be applied to the light emitting element when the driving transistor is turned ON.

On of the two electrodes of a capacitor 604 is connected to the power supply line Vi and the other is connected to the gate of the driving transistor 602. The capacitor 604 is provided so as to hold the gate voltage of the driving transistor 602 when the switching transistor 601 is not selected (OFF state). It should be noted that FIG. 6A shows a configuration having the capacitor 604, however, the invention is not limited to this and the capacitor 604 may not be provided.

When the switching transistor 601 is turned ON by a potential of the scan line Gj, a potential of a video signal which is inputted to the signal line Si is supplied to the gate of the driving transistor 602. According to the potential of the inputted video signal, the gate voltage (voltage difference between the gate and the source) of the driving transistor 602 is determined. The drain current of the driving transistor 602 which flows by the gate voltage is then supplied to the light emitting element 603, thus the light emitting element 603 emits light according to the supplied current.

Figure 6B:
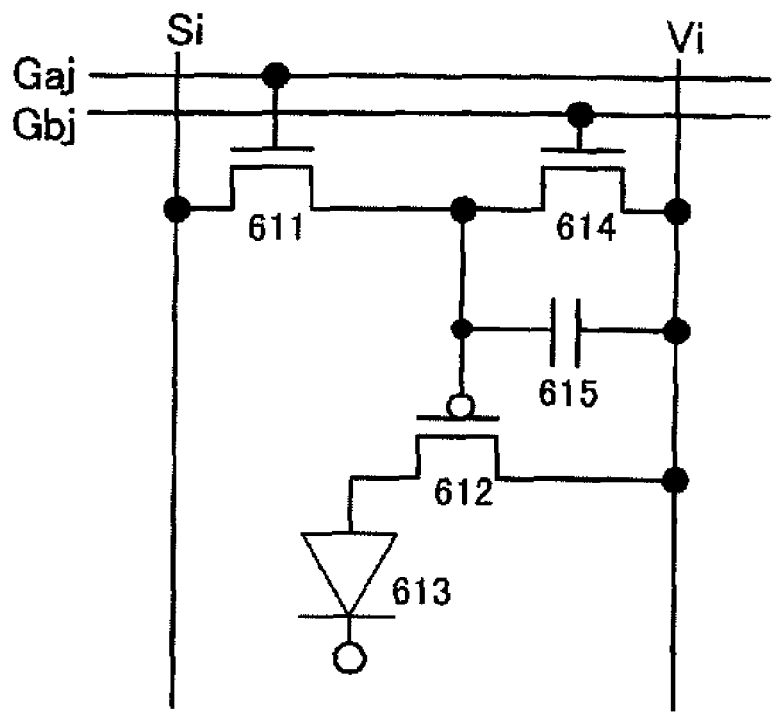

FIG. 6B shows a pixel configuration which is different from FIG. 6A. In FIG. 6B, reference numeral 611 denotes a switching transistor. The gate of the switching transistor 611 is connected to the first scan line Gaj (j=1 to y). One of the source and the drain of the switching transistor 611 is connected to the signal line Si (i=1 to x) and the other is connected to the gate of a driving transistor 612. The gate of an erasing transistor 614 is connected to the second scan line Gbj (j=1 to y). One of the source and the drain of the erasing transistor 614 is connected to the power supply line Vi (i=1 to x) and the other is connected to the gate of the driving transistor 612. One of the source and the drain of the driving transistor 612 is connected to the power supply line Vi and the other is connected to a pixel electrode of the a light emitting element 613.

The light emitting element 613 includes an anode, a cathode, and an electroluminescent layer sandwiched between the anode and the cathode. In the case where the anode is connected to the source or the drain of the driving transistor 612, the anode is the pixel electrode while the cathode is a counter electrode. On the other hand, in the case where the cathode is connected to the source or the drain of the driving transistor 612, the cathode is the pixel electrode while the anode is the counter electrode. The driving transistor 612 is desirably a P-channel transistor when the anode is the pixel electrode. On the other hand, the driving transistor 612 is desirably an N-channel transistor when the cathode is the pixel electrode. Each of the counter electrode of the light emitting element 613 and the power supply line Vi is supplied with a voltage from a power supply. A voltage difference between the counter electrode and the power supply line is kept at a level which enables a forward bias voltage to be applied to the light emitting element when the driving transistor is turned ON.

One of the two electrodes of a capacitor 615 is connected to the power supply line Vi and the other is connected to the gate of the driving transistor 612. The capacitor 615 is provided so as to store the gate voltage of the driving transistor 612 when the switching transistor 611 is not selected (OFF state). It should be noted that FIG. 6B shows a configuration having the capacitor 615, however, the invention is not limited to this and the capacitor 615 may be removed.

When the switching transistor 611 is turned ON by a potential of the first scan line Gaj, a potential of a video signal which is inputted to the signal line Si is supplied to the gate of the driving transistor 612. According to the potential of the video signal, the gate voltage (voltage difference between the gate and the source) of the driving transistor 612 is determined. The drain current of the driving transistor 612 which flows by the gate voltage is then supplied to the light emitting element 613, thus the light emitting element 613 emits light according to the supplied current.

Further, when the erasing transistor 614 is turned ON by a potential of the second scan line Gbj, a potential of the power supply line Vi is supplied to both the gate and the source of the driving transistor 612. Thus, the driving transistor 612 is turned OFF, and the emission of the light emitting element 613 is forcibly terminated.

In the case of using the pixels shown in FIG. 6A and FIG. 6B, the video signal may be either an analog signal or a digital signal. In the case of a digital signal, a gray level can be expressed by controlling a period (light emission period) in which a light emitting element emits light. However, the light emitting element shown in FIG. 5A is also effective for an analog drive since stable white emission can be supplied with the unchanged form of the emission spectrum even in the case where a current density is changed.

The structure shown in this embodiment is only an example of the light emitting device of the invention, therefore, the invention is not limited to this structure. In addition, although each of FIG. 6A and FIG. 6B employs a method of inputting a video signal as a voltage, the invention can be applied to a light emitting device in which a video signal is inputted as a current as well.

Embodiment 3

Figure 7:
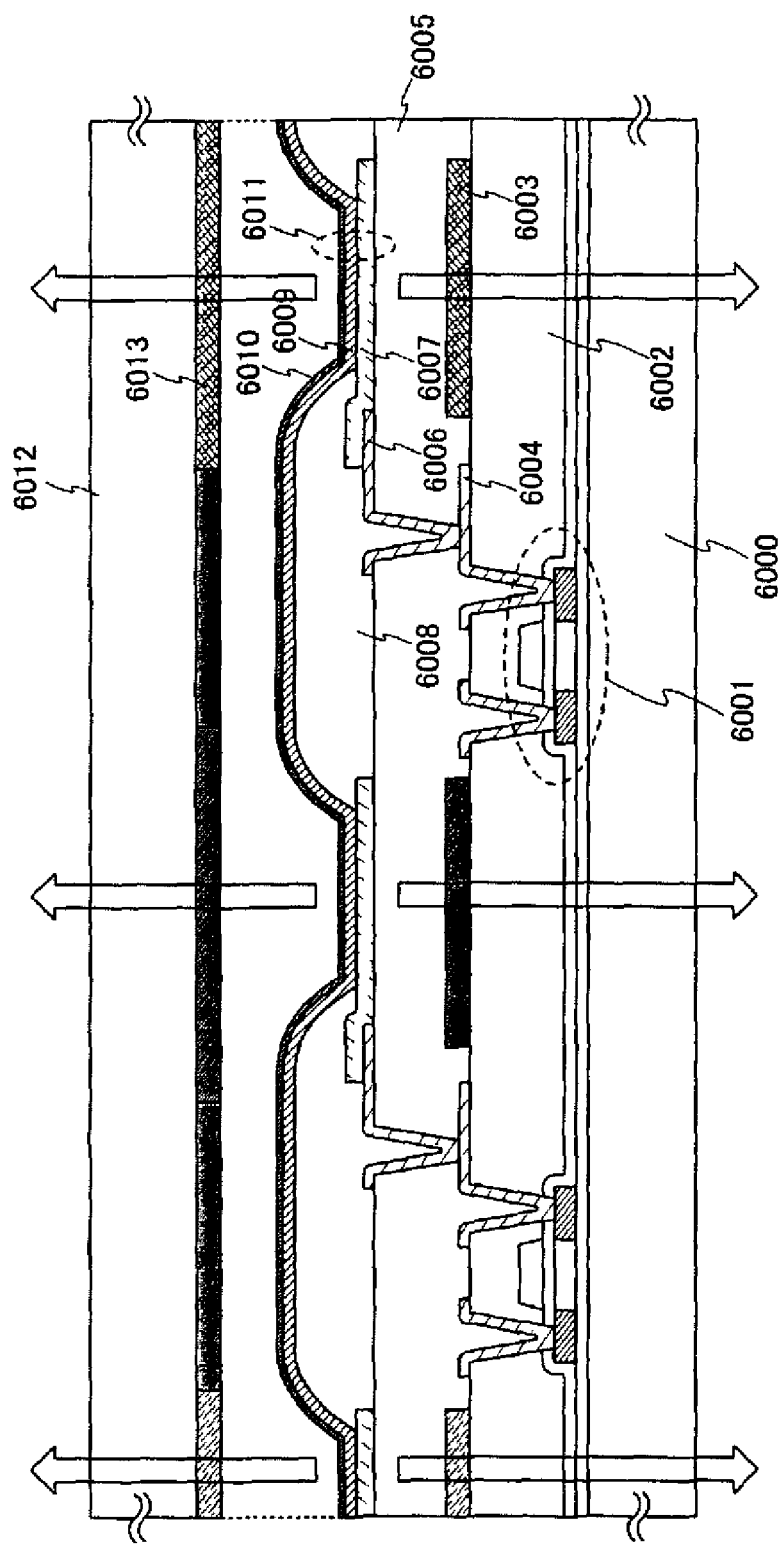
FIG. 7 is a diagram showing a cross sectional structure of a pixel of a light emitting device.

A cross sectional structure of a pixel of the light emitting device of the invention is described with reference to FIG. 7. In FIG. 7, a transistor 6001 is formed on a substrate 6000. The transistor 6001 is covered with a first interlayer insulating film 6002. On the first interlayer insulating film 6002, a color filter 6003 which is formed of resin and the like and a wiring 6004 which is electrically connected to the transistor 6001 through a contact hole are formed.

Then, a second interlayer insulating film 6005 is formed over the first interlayer insulating film 6002 so as to cover the color filter 6003 and the wiring 6004. It should be noted that the first interlayer insulating film 6002 or the second interlayer insulating film 6005 may be formed by laminating a silicon oxide film, a silicon nitride film, and a silicon oxynitride film in single or multiple layers by plasma CVD or sputtering. Alternatively, a laminate film in which a silicon oxynitride film having a higher mole fraction of oxygen than that of nitride is stacked over a silicon oxynitride film having a higher mole fraction of nitride than that of oxygen may be used as the first interlayer insulating film 6002 or the second interlayer insulating film 6005. In addition, an organic resin film may be used as the first interlayer insulating film 6002 or the second interlayer insulating film 6005. An insulating film including an Si—O—Si bond which is formed of a siloxane-based material as a starting material (hereinafter referred to as a siloxane-based insulating film) may be used as well. The siloxane-based insulating film may include at least one of hydrogen, fluorine, an alkyl group, and aromatic hydrocarbon as a substituent.

On the second insulating film 6005, a wiring 6006 which is electrically connected to the wiring 6004 through a contact hole and an anode 6007 which is electrically connected to the wiring 6006 are formed. The anode 6007 is formed in the position which overlaps with the color filter 6003 interposing the second interlayer insulating film 6005 therebetween.

Over the second interlayer insulating 6005, an organic resin film 6008 is formed as a bank. The organic resin film 6008 has an opening, and in the opening, the anode 6007, an electroluminescent layer 6009, and a cathode 6010 are overlapped with each other so as to form a light emitting element 6011. The electroluminescent layer 6009 has a single light emitting layer or multiple layers including a light emitting layer. It should be noted that a passivation film may be deposited over the organic resin film 6008 and the cathode 6010. In this case, as for the passivation film, a film that allows with difficulty in comparison with other insulating films, to transmit substances such as moisture and oxygen that may cause the deterioration of the light emitting element is used. Typically, for example, a DLC film, a carbon nitride film, a silicon nitride film formed by RF sputtering, or the like is desirably used. Alternatively, the passivation film may be provided by laminating the above-described film that allows with difficulty to transmit substances such as moisture and oxygen, and a film that allows with ease, in comparison with the former film, to transmit substances such as moisture and oxygen.

The organic resin film 6008 is, before the electroluminescent layer 6009 is formed, heated in an vacuum atmosphere in order to remove absorbed moisture, oxygen, and the like. Specifically, heat treatment is applied in a vacuum atmosphere at a temperature of 100° C. to 200° C. for about 0.5 to 1 hour. The vacuum is desirably set at $3 \times 10^{-7}$ Torr or less, and if possible, most desirably at $3 \times 10^{-8}$ Torr or less. In the case of depositing the electroluminescent layer after applying heat treatment onto the organic resin film in the vacuum atmosphere, the reliability can be further enhanced by maintaining the vacuum atmosphere until immediately before the deposition.

As for an end portion of the opening of the organic resin film 6008, it is desirable to be formed roundish so that the electroluminescent layer 6009 formed to be partially overlapped with the organic resin film 6008 will have no holes in the end. Specifically, a curvature radius of the curved line shown by the cross sectional view of the organic resin film in the opening is desirably in the range of 0.2 to 2 i m.

According to the above structure, the coverage of an electroluminescent layer and the cathode can be enhanced, and it can be prevented that the anode 6007 and the cathode 6010 are short-circuited in the hole formed in the electroluminescent layer 6009. Moreover, by alleviating the stress of the electroluminescent layer 6009, a defect called shrink, in which a light emitting region decreases, can be reduced and the reliability can thus be enhanced.

In an example shown in FIG. 7C, a positive photosensitive acrylic resin is used as the organic resin film 6008. Photosensitive organic resin is classified into a positive type in which a portion of resin that is exposed to an energy beam such as photon, electron, and ion is removed, and a negative type in which the exposed portion remains intact whereas the rest is removed. In the invention, a negative organic resin film may be used as well. In addition, the organic resin film 6008 may be formed by using photosensitive polyimide. When the organic resin film 6008 is formed by using negative photosensitive acrylic, an end portion of the opening takes on a shape of S-shaped cross-section. It is desirable that curvature radius of the curved line in an upper end portion and a lower end portion of the opening be from 0.2 to 2 i m.

The anode 6007 can be formed of a transparent conductive film. For example, a transparent conductive film in which indium oxide is mixed with 2 to 20% of zinc oxide, indium tin oxide including ITO and silicon oxide, or the like can be used as well as ITO. FIG. 7 employs ITO as the anode 6007. The anode 6007 may be polished by the method of CMP or the wipe using a PVA (polyvinyl alcohol) porous body to be planarized of its surface. After polishing the surface of the anode 6007 by CMP, it may be subjected to ultraviolet irradiation, oxygen plasma treatment, or the like.

The cathode 6010 is formed thin enough to transmit light, and any known material can be used as long as it is a conductive film having a low work function. For example, Ca, Al, CaF, MgAg, AlLi, and the like are preferably used. In order to obtain light emitted from the cathode side, a method of employing ITO which is doped with Li to obtain a lower work function may be used as well as the method of reducing the film thickness. The light emitting element according to the invention may have a structure in which light is emitted from both sides of the anode and the cathode.

Practically, when the device is completed up to the stage of FIG. 7, a passivation film (laminate film, ultraviolet curable resin film, or the like) having good airtightness and less degasification or a light transmissive covering material 6012 is desirably used to package (seal) the device without exposing it to the air. At that time, reliability of the OLED is enhanced by filling the inside of the covering material with an inert atmosphere or providing a moisture absorbent material (e.g., barium oxide). In the invention, the covering material 6012 is provided with a color filter 6013.

The invention is not limited to the above manufacturing method. Any known method can be used for the manufacture.

Embodiment 4

Figure 8A:
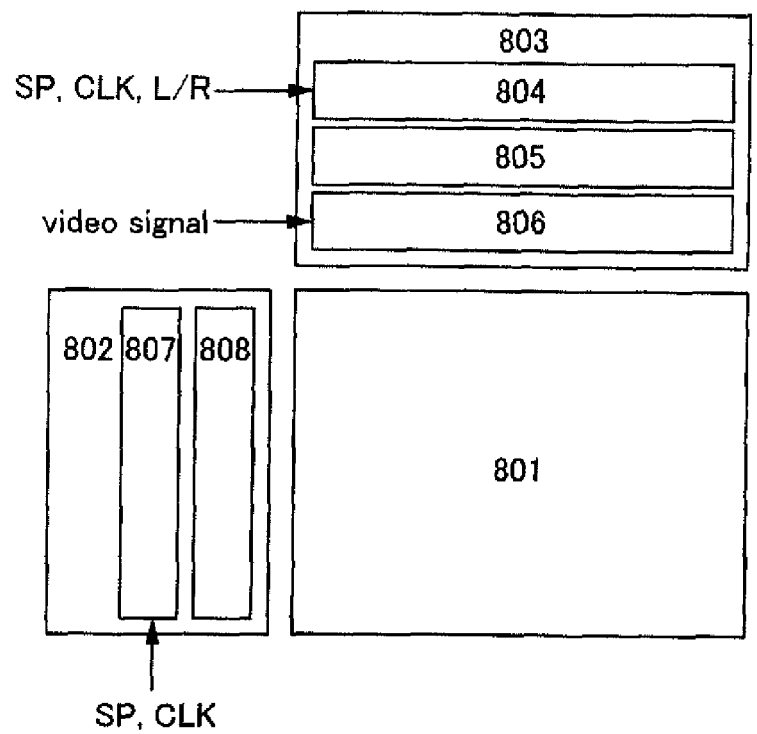
FIGS. 8A and 8B are block diagrams each showing a configuration of a light emitting device.

In this embodiment, a configuration of the light emitting device of the invention is described. FIG. 8A shows a block diagram of the light emitting device of this embodiment. The light emitting device shown in FIG. 8A includes a pixel portion 801 in which multiple pixels each having a light emitting element are disposed, a scan line driver circuit 802 for selecting each pixel, and a signal line driver circuit 803 for controlling an input of a video signal to the selected pixel.

In FIG. 8A, the signal line driver circuit 803 includes a shift register 804, a level shifter 805, and a buffer 806. The shift register 804 is inputted with a clock signal (CLK), a start pulse signal (SP), and a switch signal (L/R). When the clock signal (CLK) and the start pulse signal (SP) are inputted, a timing signal is generated in the shift register 804, which is then inputted to the level shifter 805. According to the switch signal (L/R), the order in which pulses of the timing signal appear is switched.

The timing signal is modulated in pulse level in the level shifter 805, and then inputted to the buffer 806. In the buffer 806, a video signal is sampled in synchronization with a pulse of the inputted timing signal, and it is inputted to the pixel portion 801 through a signal line.

Next, a configuration of the scan line driver circuit 802 is described. The scan line driver circuit 802 includes a shift register 807 and a buffer 808. It may include a level shifter according to the circumstances. When a clock signal (CLK) and a start pulse signal (SP) are inputted to the shift register 807 in the scan line driver circuit 802, a selection signal is generated. The generated selected signal is buffer-amplified in the buffer 808, and then supplied to a corresponding scan line. A scan line is connected to gates of transistors in one line of the pixels. Since the transistors in one line of the pixels are required to be turned ON at the same time, the buffer 808 is required to be capable of flowing a large current.

It should be noted that an alternative circuit capable of selecting a signal line such as a decoder circuit can be used instead of the shift registers 804 and 806.

The signal line driver circuit for driving the light emitting device of the invention is not limited to the configuration shown in this embodiment.

Embodiment 5

Figure 8B:
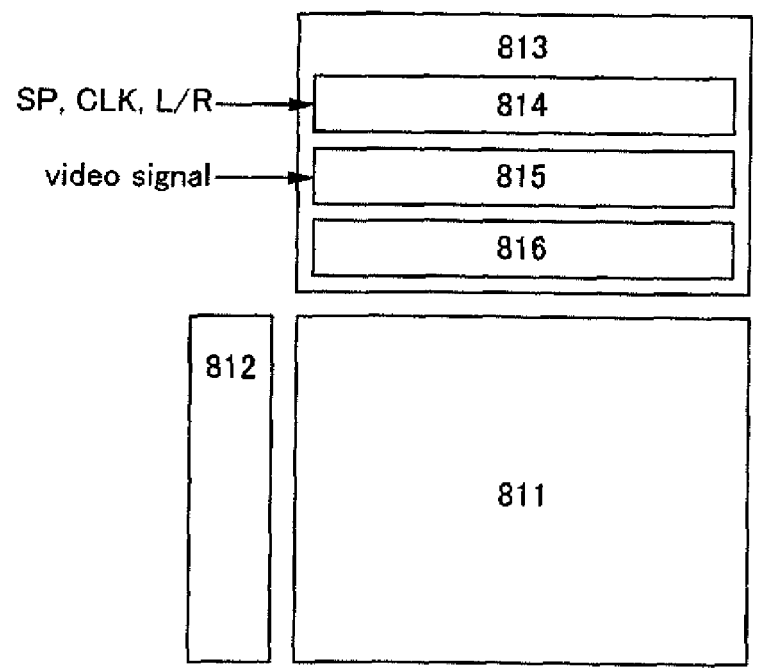

In this embodiment, a configuration of the light emitting device of the invention is described. FIG. 8B shows a block diagram of the light emitting device of this embodiment. The light emitting device shown in FIG. 8B includes a pixel portion 811 in which multiple pixels each having a light emitting element are disposed, a scan line driver circuit 812 for selecting each pixel, and a signal line driver circuit 813 for controlling an input of a video signal to the selected pixel.

In FIG. 8B, the signal line driver circuit 813 includes a shift register 814, a latch A815, and a latch B816. The shift register 814 is inputted with a clock signal (CLK), a start pulse signal (SP), and a switch signal (L/R). When the clock signal (CLK) and the start pulse signal (SP) are inputted, a timing signal is generated in the shift register 814. According to the switch signal (L/R), the order in which pulses of the timing signal appear is switched. The generated timing signal is sequentially inputted to the latch A815 on the first stage. When, the timing signal is inputted to the latch A815, a video signal is sequentially written to the latch A815 in synchronization with the pulse of the timing signal, and then held therein. It should be noted that although the video signal is sequentially written to the latch A815 in this embodiment, the invention is not limited to this. It is possible that the latch A815 having multiple stages is divided into several groups, thereby inputting a video signal to each group in parallel, namely performing a division drive. The number of groups at this time is referred to as the number of division. For example, when dividing the stages of the latch into four groups, the division drive is referred to be performed with four divided groups.

A period during which writing of video signals to the analog latch A815 of all the stages is performed is referred to as a line period. A line period in actuality may include the total period of the above line period and a horizontal fry-back period in some cases.

When one line period is completed, a latch signal (Latch Signal) is supplied to the latch B816 on the second stage. In synchronization with the latch signal, the video signals held in the latch A815 are all written into the latch B816 all at once, and then stored therein. In the latch A815 which has transferred the video signals to the latch B816, writing of the next video signals are once gain started in sequence, in synchronization with timing signal from the shift register 814. During the second line period, the video signals written to and held in the latch B816 are inputted to the pixel portion 811 through signal lines.

It should be noted that an alternative circuit capable of selecting a signal line such as a decoder circuit can be used instead of the shift register 814.

The signal line driver circuit for driving the light emitting device of the invention is not limited to the configuration shown in this embodiment.

Embodiment 6

Next, switching of a scan direction and a video signal in the case of switching a display from one screen side to the other screen side is described.

Generally, in a light emitting panel in which multiple pixels are arranged in matrix, pixels are selected on a row-by-row basis, to which a video signal is inputted. A driving method of sequentially inputting video signals to pixels in one selected row is referred to as a dot sequential drive. Meanwhile, a driving method of inputting video signals to all the pixels in one row at a time is referred to as a line sequential drive. In either of the driving methods, a video signal to be inputted to each pixel always has image data corresponding to the pixel.

Figures 9A, 9B, 9C:
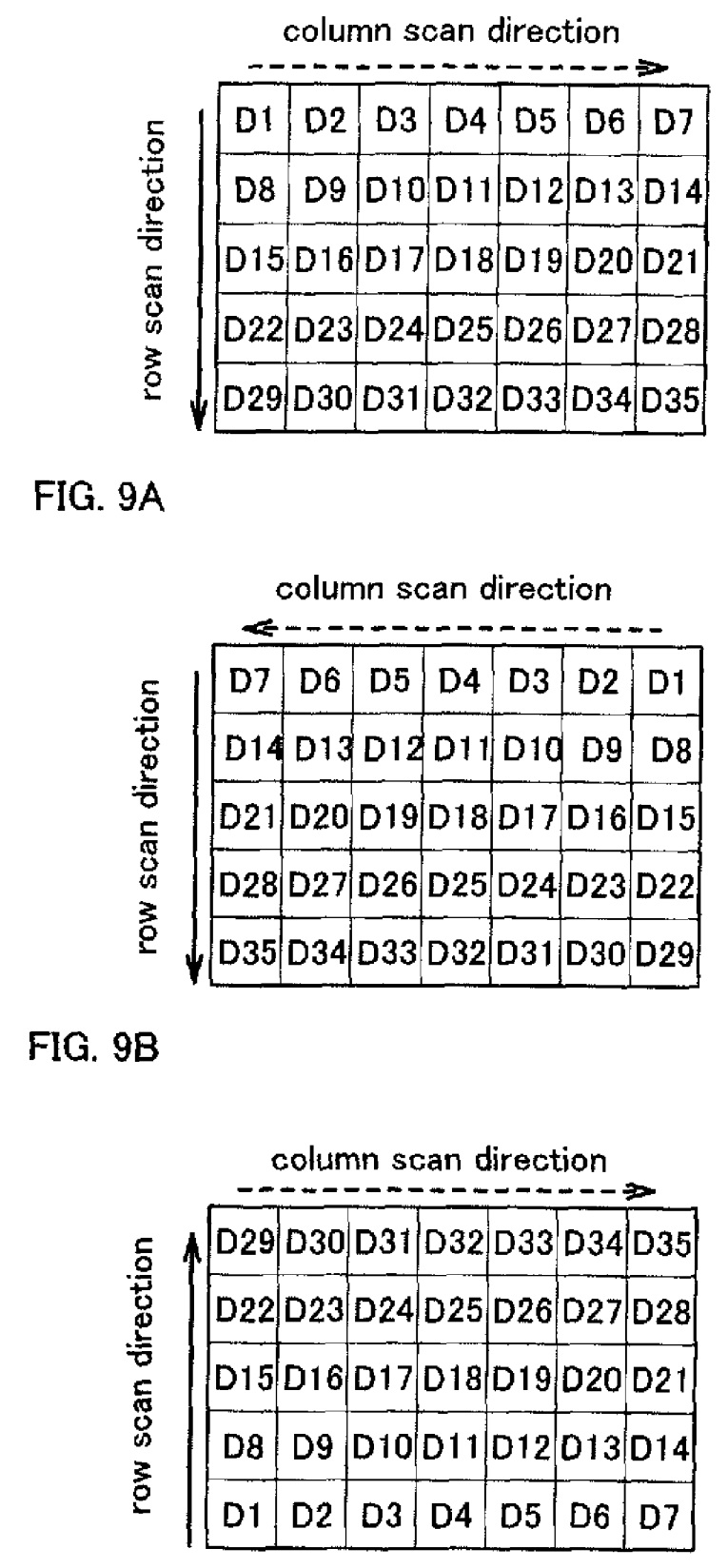

FIG. 9A shows multiple pixels arranged in matrix in a light emitting panel, and image data (D1 to D35) inputted to each of the pixels. It is assumed that a dot sequential drive is performed in the light emitting panel shown in FIG. 9A, and a scan direction of a scan line is denoted by a solid arrow as a row scan direction while the input order of video signals to pixels is denoted by a dotted arrow as a column scan direction.

FIG. 9B shows a view of the light emitting panel shown in FIG. 9A which is seen from the opposite side. On the opposite side shown in FIG. 9B, a column scan direction is in the direction from left to right which is opposite to the column scan direction from right to left in FIG. 9A. Accordingly, the input order of video signals in one row of pixels is opposite.

Thus, when switching the display screen, either of the following measures is required to be taken: a column scan direction is switched to the opposite direction, or image data of a video signal is flipped horizontally in accordance with the column scan direction.

It should be noted that the configuration of the driver circuit can be made simple in the case of switching image data to be flipped horizontally. In addition, in the case of switching the column scan direction to the opposite direction, the configuration of a controller for processing video signals in accordance with the scan direction of the light emitting panel can be simpler, which will reduce a load to the controller in driving.

Assume that a row scan direction of the light emitting panel is inverted so as to display an image on the opposite side of the light emitting panel, for example. At this time, the row scan direction on the opposite side as shown in FIG. 9C is in the opposite direction to the row scan direction in FIG. 9A. Accordingly, the input order of video signals in one row of pixels is inverted. In this case also, either of the following measures is required to be taken: a row scan direction is switched to the opposite direction, or image data of a video signal is flipped vertically in accordance with the row scan direction as in the case of FIG. 9B.

It should be noted that the description is made on the case of a dot sequential drive in this embodiment, however, in the case of a line sequential drive also, the scan direction may be switched or image data of a video signal may be flipped horizontally or vertically in switching a screen.

Embodiment 7

In this embodiment, specific configurations of a signal line driver circuit and a scan line driver circuit having a function to switch a scan direction is described.

Figure 10:
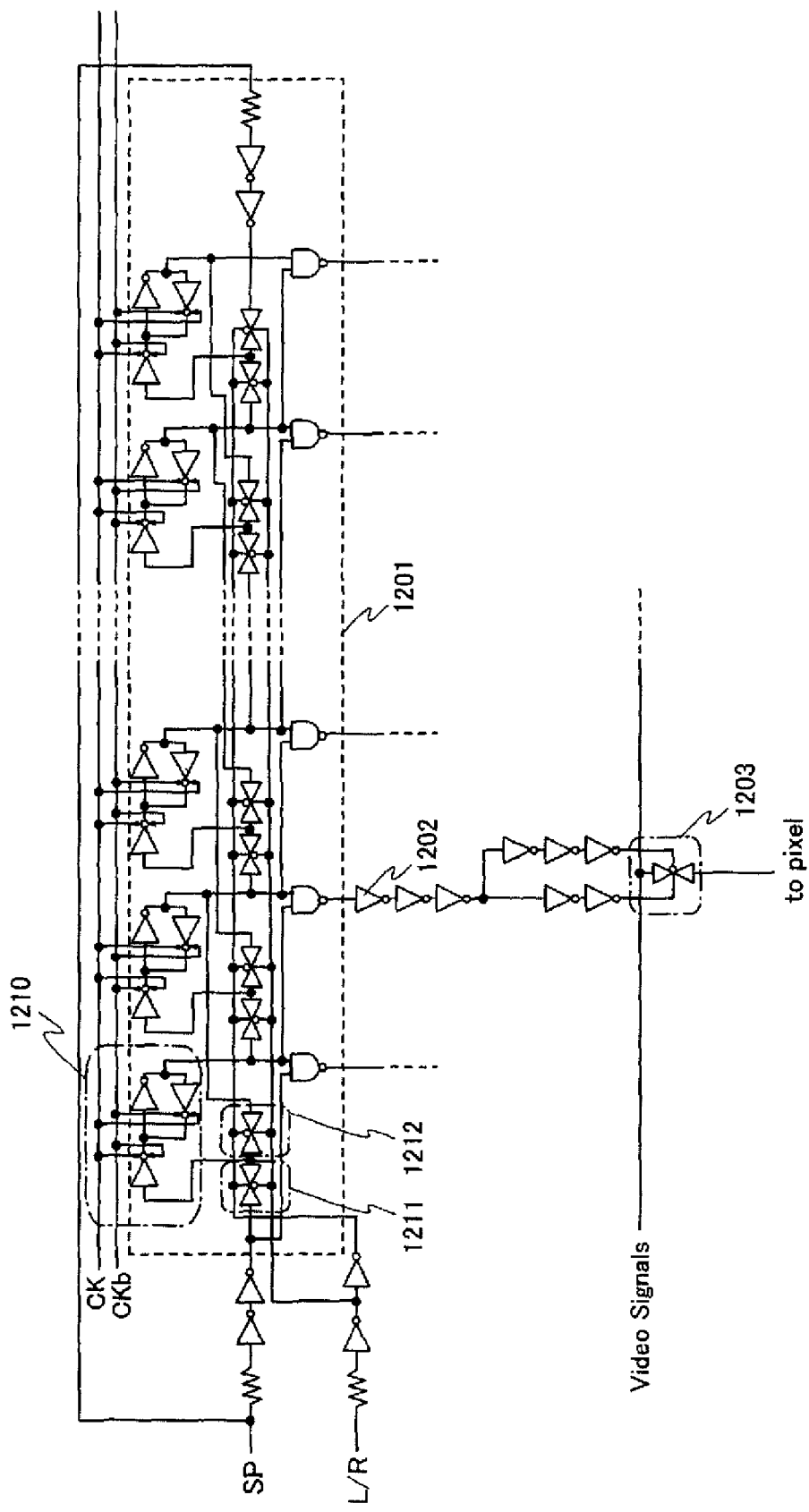
FIG. 10 is a circuit diagram of a signal line driver circuit.

FIG. 10 shows a circuit diagram of a signal line driver circuit of this embodiment. The signal line driver circuit shown in FIG. 10 corresponds to analog video signals. In FIG. 10, reference numeral 1201 denotes a shift register, which generates a timing signal for determining a sampling timing of a video signal according to a clock signal (CK), an inverted clock signal (CKb) which is inverted from the clock signal (CK), and a start pulse signal (SP).

The shift register 1201 includes multiple flip-flops 1210 and multiple transmission gates 1211 and 1212 corresponding to each flip-flop 1210 in pairs. Switching of the transmission gates 1211 and 1212 is controlled by a switch signal L/R, whereby one of them is turned ON while the other is turned OFF When the transmission gate 1211 is ON, the shift register functions as a right shift register since a start pulse signal is supplied to the flip-flop 1210 on the most left side. On the other hand, when the transmission gate 1212 is ON, the shift register functions as a left shift register since a start pulse signal is supplied to flip-flop 1210 on the most right side.

The timing signal generated in the shift register 1201 is buffer-amplified in multiple inverters 1202, and then transferred to the transmission gate 1203. It should be noted that FIG. 10 shows only one output of the shift register, that is the circuit on the rear stage (the inverter 1202 and the transmission gate 1203 here), however in actuality, multiple circuits corresponding to other outputs are provided on the rear stage.

Switching of the transmission gate 1203 is controlled by the timing signal which is buffer-amplified. When the transmission gate 1203 is ON, a video signal is sampled and supplied to each pixel in the pixel portion. In the case where the shift register 1201 functions as a right shift register, a column scan direction is from left to right whereas in the case where the shift register 1201 functions as a left shift register, the column scan direction is from right to left.

Figure 11:
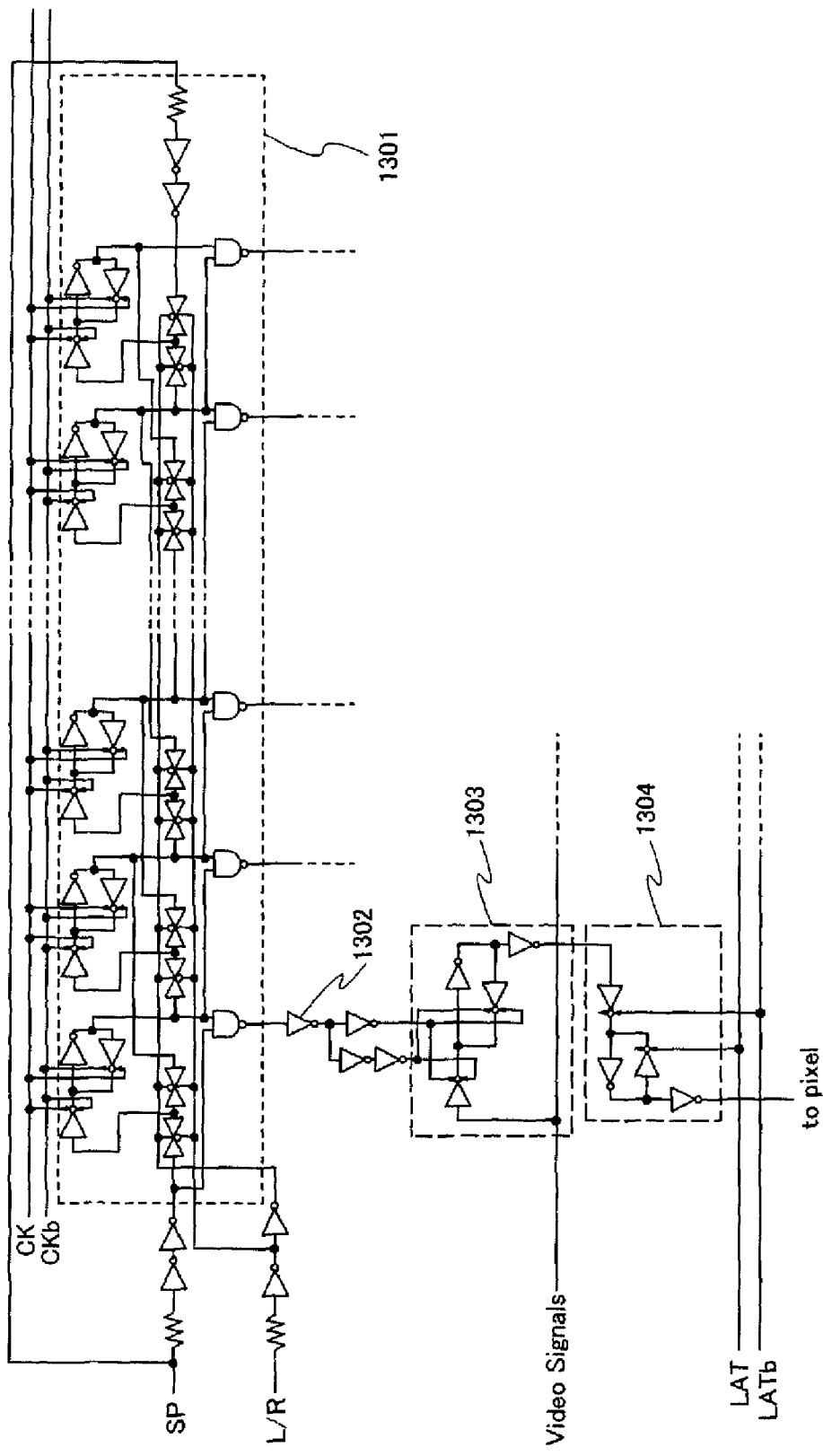
FIG. 11 is a circuit diagram of a signal line driver circuit.

FIG. 11 shows a circuit diagram of a signal line driver circuit of this embodiment. The signal line driver circuit shown in FIG. 11 corresponds to digital video signals. In FIG. 11, reference numeral 1301 denotes a shift register having the same configuration as the shift register 1201 shown in FIG. 10, in which switching of a scan direction is controlled by a switch signal L/R.

A timing signal generated in the shift register 1301 is buffer-amplified in an inverter 1302, and then inputted to a latch 1303. It should be noted that FIG. 11 shows only one output of the shift register 1301, that is the circuit on the rear stage (the inverter 1302, the latch 1303, and a latch 1304 here), however in actuality, multiple circuits corresponding to other outputs are provided on the rear stage.

The latch 1303 latches a video signal according to a timing signal. Although FIG. 11 shows only one latch 1303, multiple latches 1303 are provided in actuality, and a video signal is sequentially latched in accordance with a timing signal. The latch order can be switched by a switch signal L/R to be in the direction of left to right in the latch 1303 or right to left in the latch 1303.

When video signals are latched in all the latches 1303, the video signals held in the latches 1303 are transferred to the latches 1304 on the rear stage all at once in accordance with a latch signal LAT and its inverted signal LATb. The video signals latched in the latches 1304 are each supplied to the corresponding pixel.

Figure 12:
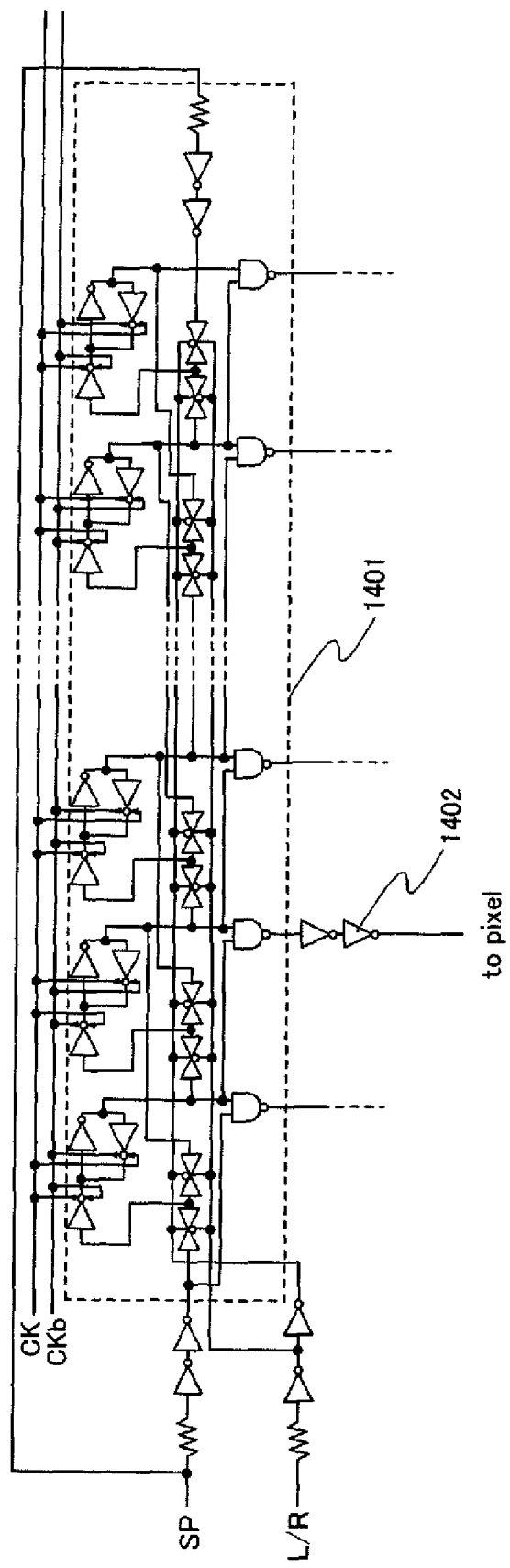
FIG. 12 is a circuit diagram of a scan line driver circuit.

FIG. 12 shows a circuit diagram of a scan line driver circuit of this embodiment. In FIG. 12, reference numeral 1401 denotes a shift register having the same configuration as the shift register 1201 shown in FIG. 10, in which switching of a scan direction is controlled by a switch signal L/R. A timing signal generated in the shift register 1401 is used for selecting the pixel in each row.

The timing signal generated in the shift register 1401 is buffer-amplified in an inverter 1402, and then inputted to the pixel. It should be noted that FIG. 12 shows only one output of the shift register 1401, that is the circuit on the rear stage (the inverter 1402 here), however in actuality, multiple circuits corresponding to other outputs are provided on the rear stage.

It should be noted that the driver circuit shown in this embodiment is one embodiment of a driver circuit which can be used for the light emitting device of the invention, and the invention is not limited to this.

Embodiment 8

Figure 13A:
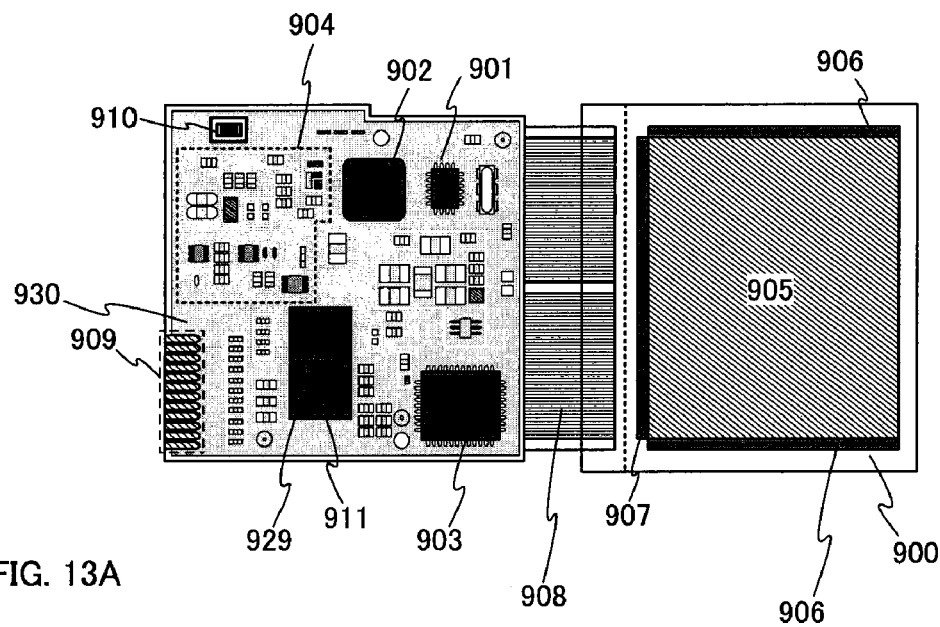
FIGS. 13A and 13B are diagrams each showing a configuration of a module of a light emitting device provided in a portable phone.

FIG. 13A shows a configuration of a portable phone as one of the electronic apparatuses of the invention. A module of the portable phone shown in FIG. 13A includes on a printed wiring board 930, a controller 901, a CPU 902, a memory 911, a power supply circuit 903, an audio processing circuit 929, and a transmitter/receiver circuit 904 as well as other elements such as a register, buffer, and a capacitor. A light emitting panel 900 is mounted on the printed wiring board 930 through an FPC 908. The light emitting panel 900 includes a pixel portion 905 in which a light emitting element is provided in each pixel, a scan line driver circuit 906 for selecting the pixel in the pixel portion 905, and a signal line driver circuit 907 for supplying a video signal to the selected pixel.

Various signals inputted from a power supply voltage, a keyboard, and the like are supplied to the printed wiring board 930 through an interface (I/F) portion 909 for a printed wiring board in which multiple input terminals are disposed. In addition, an antenna port 910 for transmitting/receiving signals between an antenna is provided on the printed wiring board 930.

It should be noted that the printed wiring board 930 is mounted on the light emitting panel 900 through the FPC 908 in this embodiment, however, the invention is not limited to this.

It is also possible that the controller 901, the audio processing circuit 929, the memory 911, the CPU 902, and the power supply circuit 903 are directly mounted on the light emitting panel 900 by using a COG (Chip on Glass) method.

In some cases, a power supply voltage and a signal are interrupted by a noise, or a rising edge of a signal is delayed due to a capacitance formed between lead wirings, a resistance of a wiring itself, and the like. Such interruption of a power supply voltage and a signal by a noise, and a delay in the rising edge of a signal can be prevented by providing various elements such as a capacitor and a buffer on the printed wiring board 930.

Figure 13B:
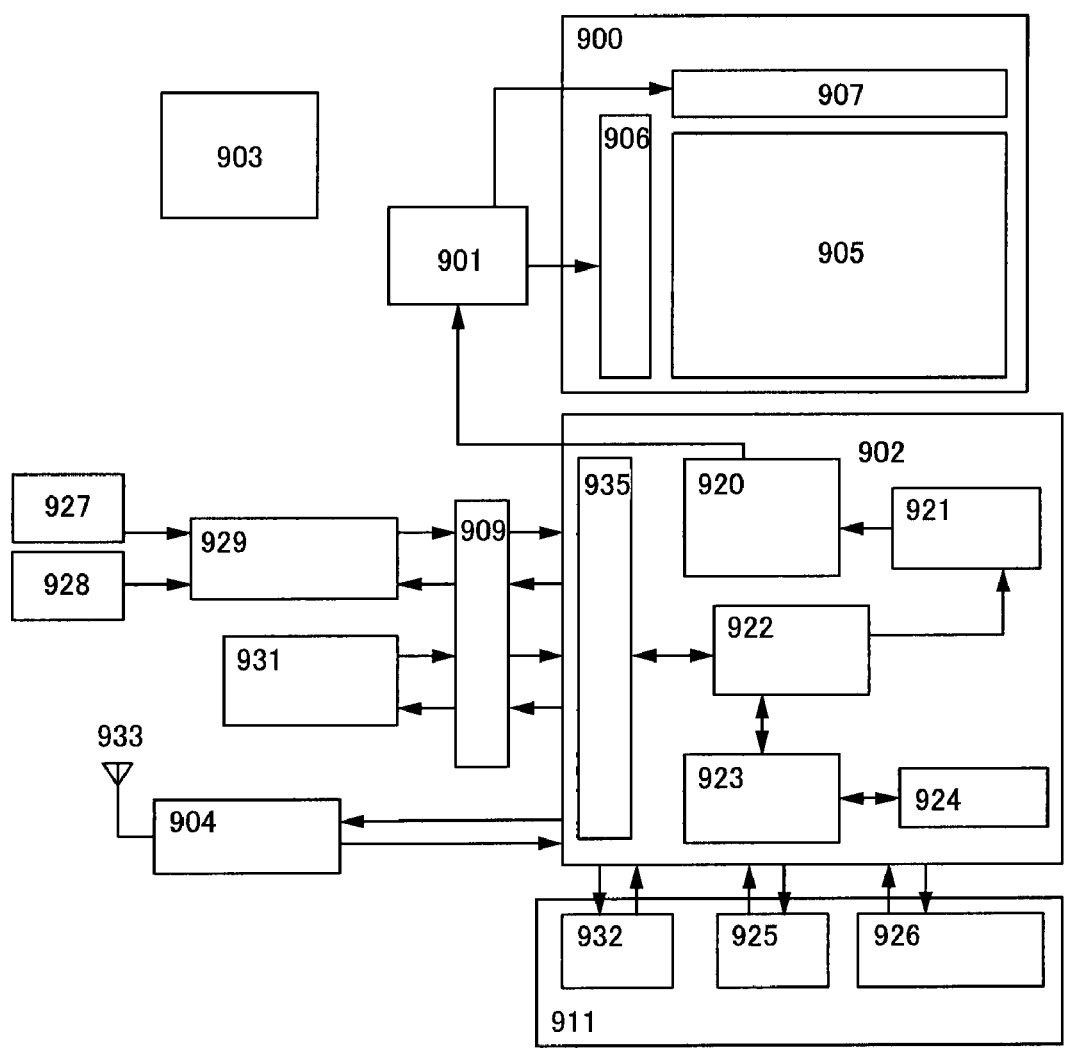

FIG. 13B is a block diagram of the module shown in FIG. 13A.

In this embodiment, a memory 911 includes a VRPM 932, a DRAM 925, and a flash memory 926. The VRAM 932 stores image data displayed on the light emitting panel 900, DRAM 925 stores image data or audio data, and the flash memory 926 stores various programs.

The power supply circuit 903 generates a power supply voltage to be supplied to the light emitting panel 900, the controller 901, the CPU 902, the audio processing circuit 929, the memory 911, and the transmitter/receiver circuit 904. Depending on the specification of the light emitting panel 900, the power supply circuit 903 is provided with a current source circuit.

The CPU 902 includes a control signal generating circuit 920, a decoder 921, a register 922, an arithmetic circuit 923, a RAM 924, an interface 935 for CPU, and the like. Various signals inputted to the CPU 902 through the interface 935 are once held in the register 922, and then inputted to the arithmetic circuit 923, the decoder 921, and the like. The arithmetic circuit 923 performs an arithmetical operation based on the inputted signal, and specifies a location to transfer various commands. Meanwhile, the signal inputted to the decoder 921 is decoded, and then inputted to the control signal generating circuit 920. The control signal generating circuit 920 generates signals including various commands based on the inputted signal, and transfers them to the location specified by the arithmetic circuit 923, specifically such as the memory 911, the transmitter/receiver circuit 904, the audio processing circuit 929, and the controller 901.

The memory 911, the transmitter/receiver 904, the audio processing circuit 929, and the controller 901 each operate according to the received command. Operation thereof is described in brief below.

A signal inputted from a keyboard 931 is transferred to the CPU 902 mounted on the printed wiring board 930 through the interface 909. The control signal generating circuit 920 transforms image data stored in the VRAM 932 into a predetermined format according to the signal transferred from the keyboard 931, and then transfers it to the controller 901.

The controller 901 performs data processing to a signal including the image data transferred from the CPU 902 in accordance with the specification of the light emitting panel 900, and then supplies it to the light emitting panel 900. The controller 901 generates an Hsync signal, a Vsync signal, a clock signal CLK, an alternating voltage (AC Cont), and a switch signal L/R based on the power supply voltage inputted from the power supply circuit 903 and various signals inputted from the CPU, and then supplies them to the light emitting panel 900.

The transmitter/receiver circuit 904 processes a signal which is transmitted/received as a radio wave in the antenna 933, and specifically, it includes a high-frequency circuit such as an isolator, a bandpass filter, a VCO (Voltage Controlled Oscillator), an LPF (Low Pass Filter), a coupler, and a balun. A signal including audio data among the signals transmitted/received in the transmitter/receiver circuit 904 is transferred to the audio processing circuit 929 according to the command from the CPU 902.

The signal including audio data transferred in accordance with the command from the CPU 902 is demodulated into an audio signal in the audio processing circuit 929, and then transferred to the speaker 928. An audio signal transferred from a microphone 927 is modulated in the audio processing circuit 929, and transferred to the transmitter/receiver circuit 904 in accordance with the command from the CPU 902.

The controller 901, the CPU 902, the power supply circuit 903, the audio processing circuit 929, and the memory 911 can be mounted as a package of the invention. The invention can be applied to any circuits other than a high-frequency circuit such as an isolator, bandpass filter, a VCO (Voltage Controlled Oscillator), an LPF (Low Pass Filter), a coupler, and a balun.

Embodiment 9

In this embodiment, the light emitting device of the invention using a flexible substrate is described. A light emitting device using a flexible substrate can be used for a display having a curved surface, a show window, and the like in addition to its thinness and light weight. Therefore, it can be applied not only to portable devices, but have a broad range of application.

Figure 14:
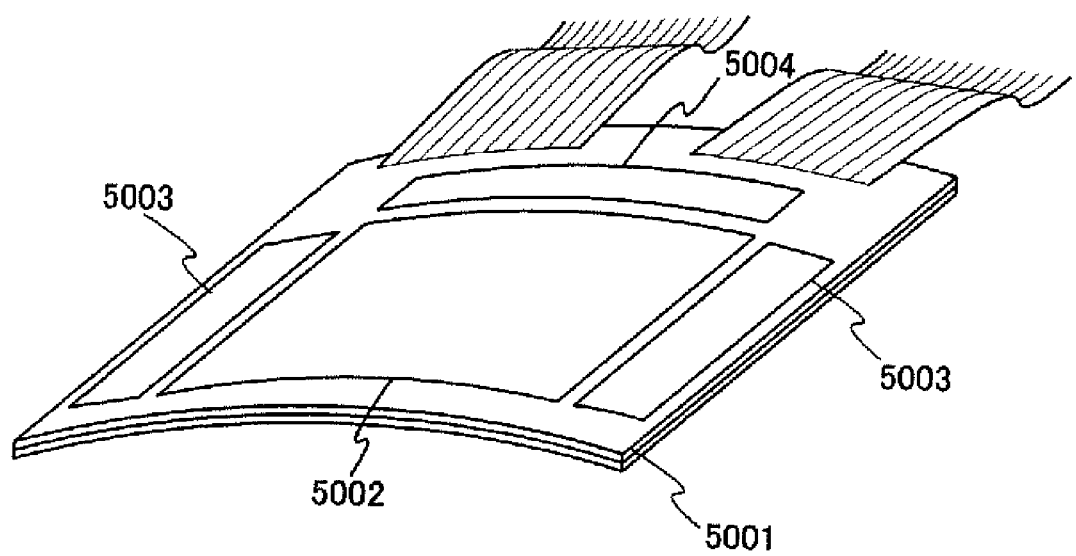
FIG. 14 is a view of a light emitting panel using a flexible substrate.

FIG. 14 shows a view of a curved light emitting device formed by using a flexible substrate. A pixel portion 5002, a scan line driver circuit 5003, and a signal line driver circuit 5004 are formed over a substrate 5001. The substrate 5001 is formed by using a material capable of standing a processing temperature in the subsequent steps.

It should be noted that various semiconductor elements used for the pixel portion 5002, the scan line driver circuit 5003, and the signal line driver circuit 5004 are not necessarily formed over the substrate 5001 directly, but can be formed once on a heat-resistant substrate so as to be transferred to another flexible substrate which is separately provided. In that case, various methods can be adopted for the transfer such as a method for providing a metal oxide film between the substrate and the semiconductor elements, whereby the metal oxide film is weakened by crystallization so as to peel off the semiconductor elements to be transferred, a method for providing an amorphous silicon film containing hydrogen between the substrate and the semiconductor elements, whereby the amorphous silicon film is removed by laser irradiation or etching so as to peel off the semiconductor elements to be transferred from the substrate, or a method for removing the substrate which is formed with the semiconductor elements mechanically or by etching with a solution or gas so as to separate the semiconductor elements to be transferred from the substrate.

Embodiment 10

Figure 15A:
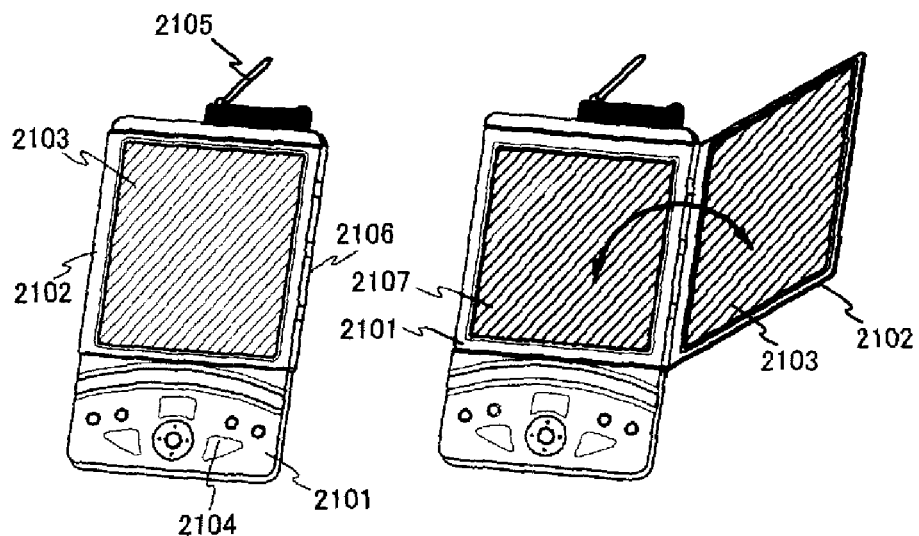
FIGS. 15A to 15C are views of electronic apparatuses of the invention.
Figure 15B:
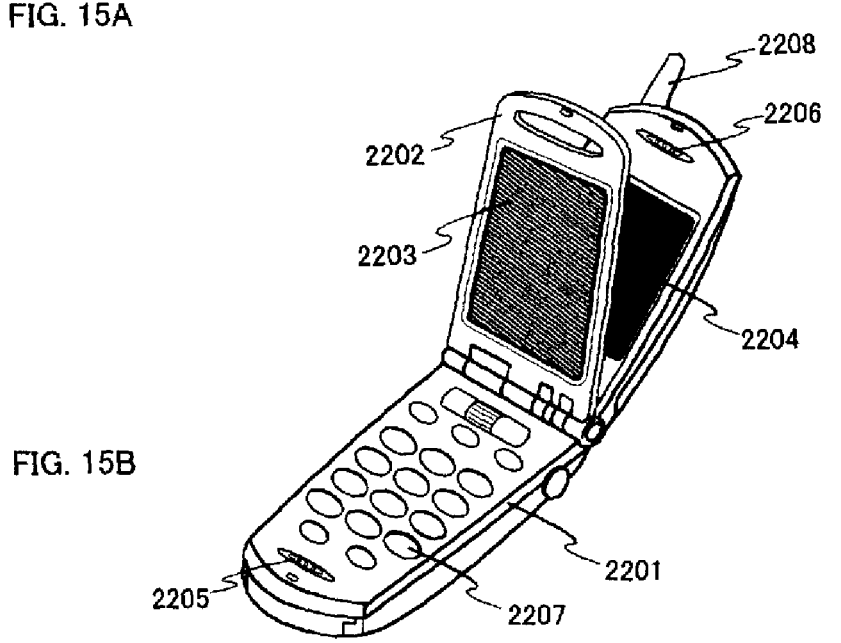
Figure 15C:
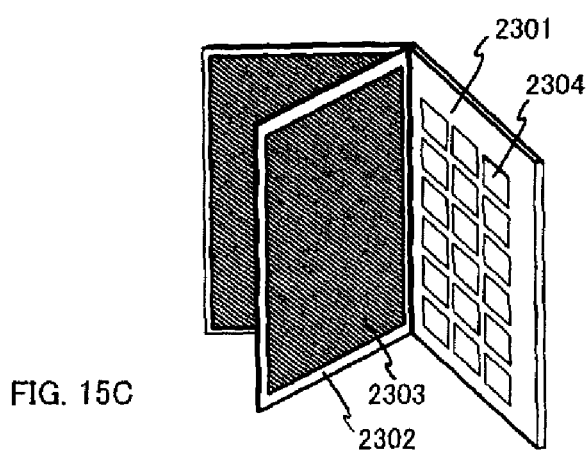

The light emitting device of the invention can be used for various electronic apparatuses. In particular, the light emitting device of the invention can be efficiently applied to portable electronic apparatuses, of which usability can be drastically enhanced by achieving the weight saving, downsizing, and enlargement of a screen. FIGS. 15A to 15C show examples of the electronic apparatuses of the invention.

FIG. 15A is a portable information terminal (PDA) including a main body 2101, a housing 2102, a display portion 2103, an operating key 2104, an antenna 2105, and the like. As shown in FIG. 15A, the dual-emission light emitting device of the invention is applied to the display portion 2103. By rotating the housing 2102 with a hinge 2106 as an axis, the rear side of the display portion 2103 can be exposed. It is possible that a display portion 2107 using another light emitting device is provided in the portion of the main body 2101 overlapping with the housing 2102.

FIG. 15B is a portable phone including a main body 2201, a housing 2202, display portions 2203 and 2204, an audio input portion 2205, an audio output portion 2206, an operating key 2207, an antenna 2208, and the like. In FIG. 15B, the dual-emission light emitting display device of the invention can be applied to the display portions 2203 and 2204.

FIG. 15C is an electronic book including a main body 2301, a housing 2302, a display portion 2303, an operating key 2304, and the like. In addition, a modem can be incorporated in the main body 2301. The dual-emission display device of the invention is applied to the display portion 2302.

As described above, the application range of the invention is so wide that it can be applied to electronic apparatuses in various fields. The electronic apparatuses of this embodiment can employ a light emitting device having any of the configurations shown in Embodiments 1 to 9.

What is claimed is:
1. An electronic apparatus comprising:
a transistor;
a first insulating layer over the transistor;
a first color filter over the first insulating layer;
a light emitting element over the first color filter, the light emitting element electrically connected to the transistor;
a second color filter provided over the light emitting element; and two liquid crystal panels sandwiching the transistor, the first insulating layer, the first color filter, the light emitting element, and the second color filter.

2. The electronic apparatus according to claim 1, wherein the electronic apparatus is used in a portable information terminal, a portable phone, or an electronic book.

3. An electronic apparatus comprising:
a transistor;
a first insulating layer over the transistor;
a first color filter over the first insulating layer;
a light emitting element over the first color filter, the light emitting element electrically connected to the transistor and comprising:
a first electrode,
a first light emitting layer over the first electrode,
a second light emitting layer over the first light emitting layer, and
a second electrode over the second light emitting layer;
a second color filter over the light emitting element; and
two liquid crystal panels sandwiching the transistor, the first insulating layer, the first color filter, the light emitting element and the second color filter.

4. The electronic apparatus according to claim 3,
wherein the first light emitting layer exhibits blue emission,
wherein the second light emitting layer comprises a host material and a phosphorescent material with a concentration of 10 wt % or more dispersed in the host material, and
wherein the second light emitting layer exhibits both phosphorescence from the phosphorescent material and emission from the phosphorescent material in an excimer state.

5. The electronic apparatus according to claim 4, wherein the highest peak in the emission spectrum of the first light emitting layer is located in the region from 400 nm to 500 nm.

6. The electronic apparatus according to claim 4, wherein the phosphorescent material exhibits emission having two or more peaks in the region from 500 nm to 700 nm, and one of the two or more peaks corresponds to excimer emission.

7. The electronic apparatus according to claim 3, wherein the electronic apparatus is used in a portable information terminal, a portable phone, or an electronic book.

8. An electronic apparatus comprising:
a power supply line;
a first transistor electrically connected to the power supply line;
a second transistor electrically connected to the first transistor;
a first insulating layer over the second transistor;
a first color filter over the first insulating layer;
a light emitting element over the first color filter, the light emitting element electrically connected to the second transistor;
a second color filter over the light emitting element; and
two liquid crystal panels sandwiching the second transistor, the first insulating layer, the first color filter, the light emitting element, and the second color filter.

9. The electronic apparatus according to claim 8, wherein the electronic apparatus is used in a portable information terminal, a portable phone, or an electronic book.

10. An electronic apparatus comprising:
a power supply line;
a first transistor electrically connected to the power supply line;
a second transistor electrically connected to the first transistor;
a first insulating layer over the second transistor;
a first color filter over the first insulating layer;
a light emitting element over the first color filter, the light emitting element electrically connected to the second transistor and comprising:
a first electrode,
a first light emitting layer over the first electrode,
a second light emitting layer over the first light emitting layer, and
a second electrode over the second light emitting layer;
a second color filter over the light emitting element; and
two liquid crystal panels sandwiching the second transistor, the first insulating layer, the first color filter, the light emitting element and the second color filter.

11. The electronic apparatus according to claim 10,
wherein the first light emitting layer exhibits blue emission,
wherein the second light emitting layer comprises a host material and a phosphorescent material with a concentration of 10 wt % or more dispersed in the host material, and
wherein the second light emitting layer exhibits both phosphorescence from the phosphorescent material and emission from the phosphorescent material in an excimer state.

12. The electronic apparatus according to claim 11, wherein the highest peak in the emission spectrum of the first light emitting layer is located in the region from 400 nm to 500 nm.

13. The electronic apparatus according to claim 11, wherein the phosphorescent material exhibits emission having two or more peaks in the region from 500 nm to 700 nm, and one of the two or more peaks corresponds to excimer emission.

14. The electronic apparatus according to claim 10, wherein the electronic apparatus is used in a portable information terminal, a portable phone, or an electronic book.

15. The electronic apparatus according to claim 1,
wherein the light emitting element comprises a first electrode and a second electrode over the first electrode, and
wherein each of the first electrode and the second electrode has a light transmitting characteristics.

16. The electronic apparatus according to claim 3, wherein each of the first electrode and the second electrode has a light transmitting characteristic.

17. The electronic apparatus according to claim 8,
wherein the light emitting element comprises a first electrode and a second electrode over the first electrode, and
wherein each of the first electrode and the second electrode has a light transmitting characteristic.

18. The electronic apparatus according to claim 10, wherein each of the first electrode and the second electrode has a light transmitting characteristic.

19. The electronic apparatus according to claim 8, wherein the first transistor and the second transistor are connected in series between the power supply line and the light emitting element.

20. The electronic apparatus according to claim 10, wherein the first transistor and the second transistor are connected in series between the power supply line and the light emitting element.

* * * * *